United States Patent

Shin

[11] Patent Number: 5,991,341
[45] Date of Patent: Nov. 23, 1999

[54] TCM DECODER OF HIGH DEFINITION TELEVISION RECEIVER AND DECODING METHOD

[75] Inventor: Hyun-soo Shin, Suwon, Rep. of Korea

[73] Assignee: Samsung Electronics Co., Ltd., Kyungki-do, Rep. of Korea

[21] Appl. No.: 09/027,195

[22] Filed: Feb. 20, 1998

[30] Foreign Application Priority Data

Feb. 21, 1997 [KR] Rep. of Korea ............. 97-5255

[51] Int. Cl.⁶ ........................... H04L 23/02; H04N 5/21
[52] U.S. Cl. ........................... 375/265; 348/608
[58] Field of Search ................... 375/265, 346;
348/608, 607, 609, 614, 665, 666, 667,
668, 470; 455/295, 296, 303

[56] References Cited

U.S. PATENT DOCUMENTS

| | | | |
|---|---|---|---|
| 5,508,752 | 4/1996 | Kim et al. | 348/608 |
| 5,512,957 | 4/1996 | Hulyalkar | 348/607 |
| 5,648,822 | 7/1997 | Hulyalkar | 348/607 |
| 5,875,001 | 2/1999 | Kwak | 348/607 |

FOREIGN PATENT DOCUMENTS

WO 96/02100  1/1996  WIPO .............. H04L 25/03

OTHER PUBLICATIONS

"A VLSI Architecture of the Trellis Decoder Block for the Digital HDTV Grand Alliance System"; Dae–il Oh, et al., IEEE Trans. On Consumer Electronics, vol. 42, No. 3, Aug. 1996, pp. 346–355.

*Primary Examiner*—Stephen Chin
*Assistant Examiner*—Albert Park
*Attorney, Agent, or Firm*—Sughrue, Mion, Zinn, Macpeak & Seas, PLLC

[57] ABSTRACT

A trellis-coded modulation (TCM) decoder of a high-definition television (HDTV) receiver is disclosed for use in US-type terrestrial broadcasting, as is a corresponding decoding method. The TCM decoder optionally uses a NTSC-reject comb filter to remove the interference from a co-channel NTSC-type signal. When the input HDTV signal has been passed through the NTSC rejection filter, an 8-state decoding mode is appropriate and a segment sync suspension unit is used to directly connect the data before and after a twelve symbol segment sync. When the input HDTV signal has not been passed through the NTSC rejection filter, an 4-state decoding mode is appropriate and the input HDTV signal is passed unchanged (i.e., without use of the segment sync suspension unit). A field delay directly connects the data of the data segment just before the field sync segment to the data of the data segment just after the field sync segment. A Viterbi decoder decodes the output of the field delay in both an 8-state case and a 4-state case. Therefore, decoding is performed in consideration of the effects of uncoded segment sync and field sync signals, thereby achieving stable decoding.

26 Claims, 24 Drawing Sheets

| O₁ O₂ O₃ | Mout | O₁ O₂ O₃ | Mout | O₁ O₂ O₃ | Mout |
|---|---|---|---|---|---|
| -1, -1, -1 | -14 | 0, -1, -1 | -6 | 1, -1, -1 | 2 |
| -1, -1, 0 | -12 | 0, -1, 0 | -4 | 1, -1, 0 | 4 |
| -1, -1, 1 | -10 | 0, -1, 1 | -2 | 1, -1, 1 | 6 |
| -1, 0, -1 | -10 | 0, 0, -1 | -2 | 1, 0, -1 | 6 |
| -1, 0, 0 | -8 | 0, 0, 0 | 0 | 1, 0, 0 | 8 |
| -1, 0, 1 | -6 | 0, 0, 1 | 2 | 1, 0, 1 | 10 |
| -1, 1, -1 | -6 | 0, 1, -1 | 2 | 1, 1, -1 | 10 |
| -1, 1, 0 | -4 | 0, 1, 0 | 4 | 1, 1, 0 | 12 |
| -1, 1, 1 | -2 | 0, 1, 1 | 6 | 1, 1, 1 | 14 |

FIG. 7

| PREV. STATE ($S_1S_2S_3$) | CV. INPUT ($I_2$) | TRAN. STATE ($S_1S_2S_3$) | ENCODER OUTPUT ($O_1,O_2,O_3$) | DECODER OUTPUT ($I_1I_2$) | PREV. STATE ($S_1S_2S_3$) | CV. INPUT ($I_2$) | TRAN. STATE ($S_1S_2S_3$) | ENCODER OUTPUT ($O_1,O_2,O_3$) | DECODER OUTPUT ($I_1I_2$) |
|---|---|---|---|---|---|---|---|---|---|
| 000 (000) | 0 | 000 (000) | -1, 0, 0(-8) | 10 | 100 (001) | 0 | 000 (000) | -1,-1, 0(-12) | 10 |
| | | | 0, 0, 0( 0) | 00 | | | | 0,-1, 0(-4) | 00 |
| | | | 1, 0, 0( 8) | 10 | | | | 1,-1, 0(4) | 10 |
| | 1 | 110 (100) | -1, 1, 0(-4) | 11 | | 1 | 110 (100) | -1, 0, 0(-8) | 11 |
| | | | 0, 1, 0( 4) | 01 | | | | 0, 0, 0( 0) | 01 |
| | | | 1, 1, 0(12) | 11 | | | | 1, 0, 0( 8) | 11 |
| 001 (010) | 0 | 010 (101) | -1, 0,-1(-8) | 10 | 101 (011) | 0 | 010 (101) | -1,-1,-1(-14) | 10 |
| | | | 0, 0,-1(-2) | 00 | | | | 0,-1,-1(-6) | 00 |
| | | | 1, 0,-1( 6) | 10 | | | | 1,-1,-1( 2) | 10 |
| | 1 | 100 (001) | -1, 1,-1(-6) | 11 | | 1 | 100 (001) | -1, 0,-1(-10) | 11 |
| | | | 0, 1,-1( 2) | 01 | | | | 0, 0,-1(-2) | 01 |
| | | | 1, 1,-1(10) | 11 | | | | 1, 0,-1( 6) | 11 |
| 010 (101) | 0 | 001 (010) | -1, 0, 1(-6) | 10 | 110 (100) | 0 | 001 (010) | -1,-1, 1(-10) | 10 |
| | | | 0, 0, 1( 2) | 00 | | | | 0,-1, 1(-2) | 00 |
| | | | 1, 0, 1(10) | 10 | | | | 1,-1, 1(6) | 10 |
| | 1 | 111 (110) | -1, 1, 1(-2) | 11 | | 1 | 111 (110) | -1, 0, 1(-6) | 11 |
| | | | 0, 1, 1( 6) | 01 | | | | 0, 0, 1( 2) | 01 |
| | | | 1, 1, 1(14) | 11 | | | | 1, 0, 1(10) | 11 |
| 000 (111) | 0 | 011 (111) | -1, 0, 0(-8) | 10 | 111 (110) | 0 | 011 (111) | -1,-1, 0(-12) | 10 |
| | | | 0, 0, 0( 0) | 00 | | | | 0,-1, 0(-4) | 00 |
| | | | 1, 0, 0( 8) | 10 | | | | 1,-1, 0( 4) | 10 |
| | 1 | 010 (011) | -1, 1, 0(-4) | 11 | | 1 | 010 (011) | -1, 0, 0(-8) | 11 |
| | | | 0, 1, 0( 4) | 01 | | | | 0, 0, 0( 0) | 01 |
| | | | 1, 1, 0(12) | 11 | | | | 1, 0, 0( 8) | 11 |

TRANSITIONS SHARED BY
4-STATE AND 8-STATE

TRANSITIONS SHARED BY
4-STATE AND 8-STATE

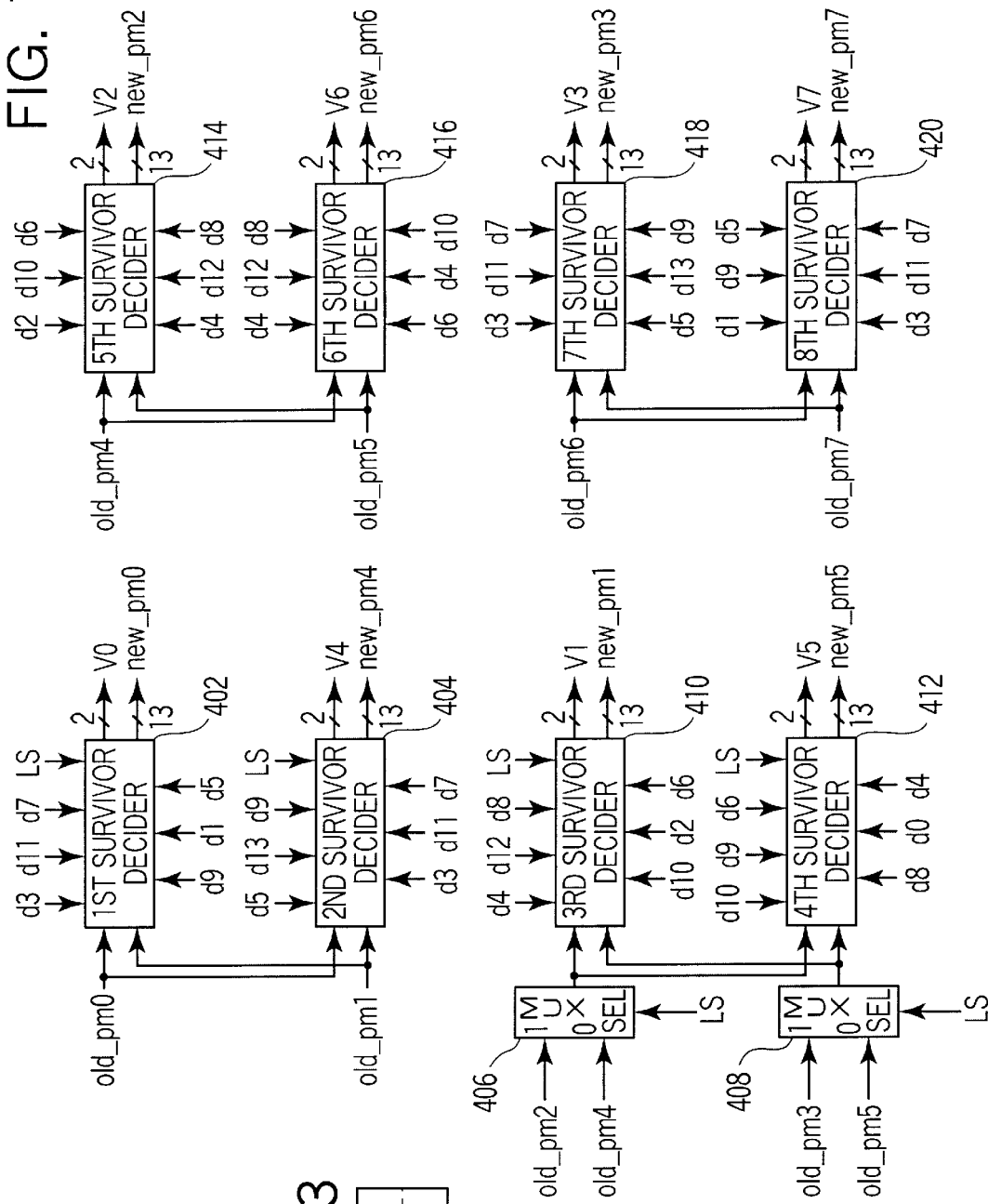

FIG. 23

| addr. | OUTPUT | | addr. | OUTPUT | | addr. | OUTPUT | | addr. | OUTPUT | |
|---|---|---|---|---|---|---|---|---|---|---|---|
| | ROM1 | ROM2 | | ROM1 | ROM2 | | ROM1 | ROM2 | | ROM1 | ROM2 |
| 00h | 10b | 00b | 08h | 10b | 01b | 10h | 11b | — | 18h | 11b | — |
| 01h | 00b | 10b | 09h | 00b | 11b | 11h | 01b | — | 19h | 01b | — |
| 02h | 10b | 11b | 0Ah | 10b | 00b | 12h | 11b | — | 1Ah | 11b | — |
| 03h | 00b | 01b | 0Bh | 00b | 10b | 13h | 01b | — | 1Bh | 01b | — |
| 04h | 11b | 00b | 0Ch | 11b | 11b | 14h | 10b | — | 1Ch | 10b | — |
| 05h | 01b | 10b | 0Dh | 01b | 01b | 15h | 00b | — | 1Dh | 00b | — |
| 06h | 11b | 11b | 0Eh | 11b | 10b | 16h | 10b | — | 1Eh | 10b | — |
| 07h | 01b | 01b | 0Fh | 01b | 00b | 17h | 00b | — | 1Fh | 00b | — |

TCM DECODER OF HIGH DEFINITION TELEVISION RECEIVER AND DECODING METHOD

BACKGROUND OF THE INVENTION

1. Field of the Invention

The present invention relates to a trellis-coded modulation (TCM) decoder and a decoding method for use in the TCM decoder. More particularly, the present invention relates to a TCM decoder for use in a high-definition television (HDTV) receiver and a decoding method therefor.

2. Description of the Related Art

In general, for a large-screen, high resolution TV, a grand alliance-high definition television (GA-HDTV)has been developed in the United States, and a vestigial side band (VSB) modulation method for digital transmission has been adopted as a modulation method for the GA-HDTV. Such a GA-HDTV adopting the VSB modulation method is called a "GA-VSB" system. An 8-VSB modulation method using 8 levels has been used for the GA-HDTV for a terrestrial broadcast mode. A 16-VSB modulation method using 16 levels for a high-speed cable mode has been used for the GA-HDTV.

One of characteristics of the GA-VSB system, as the standard for an HDTV for the US-type terrestrial broadcasting, is a TCM method used in order to increase noise immunity. The TCM refers to a modulation method having an error correction function based on a conventional modulation method, by which performance in transmission can increase without increasing channel bandwidth.

The structure of a TCM encoder of a GA-VSB system is shown in FIG. 1A. In FIG. 1A, the TCM encoder receives two bits $I_1$ and $I_2$ as inputs. A convolution encoder 106 receives one bit $I_2$ and outputs two bits $O_2$ and $O_3$, and a precoder 100 receives the remaining bit $I_1$ and outputs one bit $O_1$. The precoder 100 is another feature of the GA-VSB system and is used to cope with the use of an National Television System Committee (NTSC) rejection filter by a receiver. Thus, when a total of three bits $O_1$, $O_2$, and $O_3$ are input to a mapper 114. As shown in FIG. 1B, the mapper 114 produces one output symbol value $M_{OUT}$, at one of 8 levels, which has a relationship of one-to-one correspondence with the combination of inputs $O_1$, $O_2$, and $O_3$. Here, delay units 104, 108 and 112, designated by "D", delay input data by a 12-symbol period, which provides the same effect as when twelve encoders each having a unit delay, arranged in parallel, are used. This is called "12-symbol interleaving". The adverse affects of burst-type noise can be reduced, and the state number of the TCM decoder, which increases when the NTSC rejection filter is used at a receiver, can be decreased by means of the 12-symbol interleaving.

Assuming that the TCM encoder shown in FIG. 1A is a single encoder having a unit delay, the operation of the TCM encoder when the previous states of the delay units 108 and 112 are "00" will be described.

When the least significant bit (LSB; $I_2$) of the two bit parallel input is "0", the next state of the convolution encoder 106 which has received the LSB ($I_2$) of "0" becomes "00", and the two bit output $O_2 O_3$ of the convolution encoder 106 becomes "00". The output of the mapper 114 is determined according to the most significant bit (MSB; $I_1$) of the two bits input in parallel. When the MSB ($I_1$) is "0", that is, the input $I_1 I_2$ of the TCM encoder is "00", the output of the mapper 114 becomes "−7(000)". Also, when the MSB ($I_1$) is "1", that is, the input $I_1 I_2$ of the encoder is "10", the output of the mapper 114 becomes "1(100)".

On the other hand, when the LSB ($I_2$) of the two bits input in parallel to the encoder is "1", the next state of the convolution encoder 106 which has received the LSB ($I_1$) of "1" becomes "01" and the output of the convolution encoder 106 becomes "10". The output of the mapper 114 becomes "−3(010)" or "5(110)" according to the logic state of the MSB ($I_1$) input to the precoder 100.

Such states of the TCM encoder shown in FIG. 1A are shown as a trellis diagram in FIG. 2. The number of memories (corresponding to delay units) of the convolution encoder 106 of FIG. 1A equals two, thus the total number of states is equal to four. Since one bit remains without going through the convolution coding, the number of parallel paths, representing the number of possible transitions into another state, becomes two. For example, if the previous state is "10", the transition into the next state "00" occurs when the input data $I_1 I_2$ of the encoder is "01" or "11", resulting in two parallel paths.

FIG. 3 is a diagram showing a data frame format of the GA-VSB system. One frame of the VSB data is comprised of two fields, and each field is comprised of a field synchronous segment (hereinafter referred to as a "sync segment") and 312 data segments. Each data segment is comprised of 4 segment sync symbols and 828 data symbols. Four segment sync symbols are also inserted into the 8-level digital data stream at the beginning of each of the field sync segments as well as each data segment. The segment sync symbols are to be used for timing restoration. Here, the segment sync is formed in a predetermined pattern where 4 symbols have the signal levels +5, −5, −5 and +5, respectively, and the remaining data has arbitrary signal levels among the 8 levels ±1, ±3, ±5 and ±7. In addition to the segment sync symbols, each field sync segment, corresponding to the first segment of each field, includes a field sync signal (FIELD SYNC #1 or FIELD SYNC #2) which indicates the start of the field. The field sync signal sequence is used for equalization and error correction decoding, thus the TCM encoder does not perform coding during that period.

The overall structure of the TCM encoder of the actual GA-VSB system, in consideration of a general segment/field sync, is shown in FIG. 4. In FIG. 4, reference numeral 120 represents a precoder, reference numeral 128 represents a convolution encoder, reference numeral 140 represents a mapper, and reference numeral 142 represents a sync inserter. Respective delay units 124, 132 and 138, each constituted of a shift register, receive their own output during the segment sync period via multiplexers (MUXs) 126, 130 and 136, respectively, according to a segment sync timing signal. Thus, data before and after the 12 symbols from the segment sync is encoded while being connected together. This is the same as the case where each encoder receiving the segment sync, in 12 TCM encoders arranged in parallel, holds the data during the segment sync and performs encoding after the next data is input. Additionally, a multiplexer (MUX) of the sync inserter 142 selects 4-symbol segment sync with a predetermined pattern of +5, −5, −5 and +5 during the segment sync period, and selects the TCM coded data, output from the mapper 140, during the other period, according to the segment sync timing signal.

On the other hand, the operation of the TCM encoder on the field sync is different from that when the segment sync is input, since the field sync period comes to 828 symbols while the segment sync period comes to 4 symbols. Thus, delay units 126, 132 and 138 of the TCM encoder continuously hold the input data during the whole field sync segment (including segment sync) until the data of data segment is input.

As above, the structure of the TCM encoder of the GA-VSB system, shown in FIGS. 1A through 4, is disclosed in the following reference [1]: *Grand Alliance HDTV system Specification*, submitted to the ACATS Technical Subgroups in February 1994. However, the structure of a TCM decoder is not disclosed yet.

SUMMARY OF THE INVENTION

To solve the above problems, it is a first object of the present invention to provide a trellis-coded modulation (TCM) decoder which satisfies the grand alliance high definition television (GA-HDTV) standard and is made using simple hardware.

It is a second object of the present invention to provide a TCM decoder which can be used when a GA-HDTV receiver uses a National Television System Committee (NTSC) rejection filter.

It is a third object of the present invention to provide a TCM decoder which performs decoding in consideration of a segment sync signal and a field sync signal.

It is a fourth object of the present invention to provide a TCM decoding method which satisfies the GA-HDTV standard.

It is a fifth object of the present invention to provide a TCM decoding method which performs decoding in consideration of a segment sync signal and a field sync signal.

According to an aspect of the present invention, there is provided a trellis-coded modulation (TCM) decoder of a receiver having a National Television System Committee (NTSC) rejection filter for rejecting interference by an NTSC signal. An input high-definition television (HDTV) signal constitutes each of its frames with two fields, each field includes a field synchronization (sync) segment and data segments, each segment includes a segment sync signal, and each field sync segment is formed of a field sync signal. The TCM decoder of the present invention has a segment sync suspension unit, a field delay, a Viterbi decoder, and a sync generator.

The segment sync suspension unit directly connects the data before and after a first predetermined number of symbols from the segment sync when the input HDTV signal has passed through the NTSC rejection filter, and passes the input HDTV signal unchanged when the input HDTV signal has not passed through the NTSC rejection filter. The field delay directly connects the data of the data segment just before the field sync segment to the data of the data segment just after the field sync segment, which are output from the segment sync suspension unit. The Viterbi decoder decodes the output of the field delay in both an 8-state case where the input HDTV signal has passed through the NTSC rejection filter and a 4-state case where the input HDTV signal has not passed through the NTSC rejection filter. The sync generator generates control signals for each unit in response to input segment sync timing signal and field sync timing signal.

Preferably, the Viterbi decoder includes a branch-metric generator, an addition-comparison selector, a trace-back memory. The branch-metric generator generates branch-metrics by calculating the error between the output of the field delay and a plurality of reference signal levels according to the 4-state/8-state mode. The addition-comparison selector selects an optimal path at the current node of each state by using each branch-metric converging on each state and a path metric accumulated up to the previous symbol, according to the 4-state/8-state mode, and outputting the selected path as an optimal path information. The trace-back memory traces back the optimal path information according to the 4-state/8-state mode to output decoded data.

According to another aspect of the present invention, there is provided a method of trellis-coded modulation (TCM) decoding a high-definition television (HDTV) signal, in which an input HDTV signal goes through National Television System Committee (NTSC) rejection filtering in order to eliminate interference by an NTSC signal, the NTSC rejection filtering performed by delaying the HDTV signal by a first predetermined number of symbols, and by subtracting the delayed signal from the HDTV signal, wherein the HDTV signal constitutes each of its frames with 2 fields, each field includes field sync segments and data segments, each segment includes a segment sync signal, and each field sync segment is formed of a field sync signal. The TCM decoding method according to the present invention includes the following steps:

(a) directly connecting the data before and after the first predetermined number of symbols based on the segment sync when the input HDTV signal has passed through the NTSC rejection filtering, and passing the input HDTV signal unchanged when the input HDTV signal has not passed through the NTSC rejection filtering;

(b) directly connecting the data of the data segment just before the field sync segment to the data of the data segment just after the field sync segment, after the step (a); and (c) Viterbi-decoding the HDTV signal obtained by the step (b) in accordance with either an 8-state case where the input HDTV signal has passed through the NTSC rejection filtering and a 4-state case where the input HDTV signal has not passed through the NTSC rejection filtering.

Preferably, step (c) has the following sub-steps:

(c1) obtaining branch-metrics by calculating the error between the data obtained by the step (b) and a plurality of reference signal levels according to the 4-state/8-state mode;

(c2) deciding the optimal path at the current node of each state by using each branch-metric converging on each state and a path metric accumulated up to the previous symbol, according to the 4-state/8-state mode, and for outputting the selected path as the optimal path information; and (c3) tracing back the optimal path information according to the 4-state/8-state mode and for outputting decoded data based on the traced-back result.

BRIEF DESCRIPTION OF THE DRAWINGS

The above objects and advantages of the present invention will become more apparent by describing in detail a preferred embodiment thereof with reference to the attached drawings in which:

FIG. 7 is a state table of the 8-state TCM encoder of FIG. 6A;

FIG. 23 is a ROM table for the first and second ROMs of FIG. 22; and

DESCRIPTION OF THE PREFERRED EMBODIMENTS

In order to achieve a decoder according to the present invention, the effect of the NTSC rejection filter must be considered when a receiver in the system uses such a rejection filter.

Figure 5A:
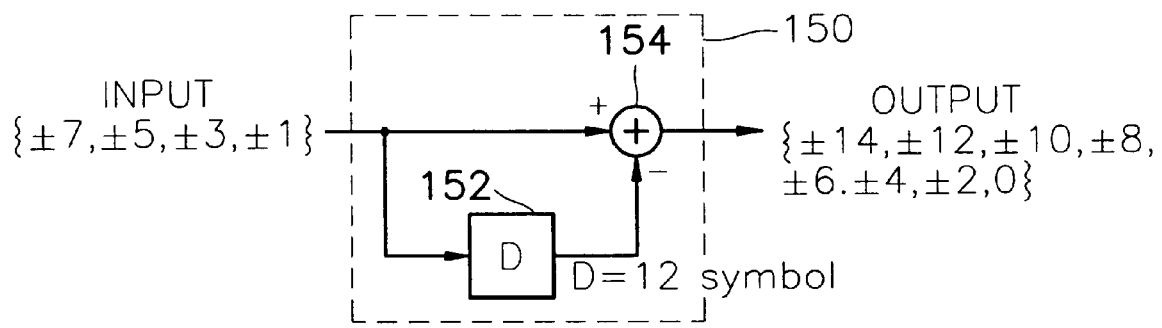
FIGS. 5A and 5B show the structure and the frequency characteristics of a National Television System Committee (NTSC) rejection filter, respectively, in order to help understanding of the present invention.
Figure 5B:
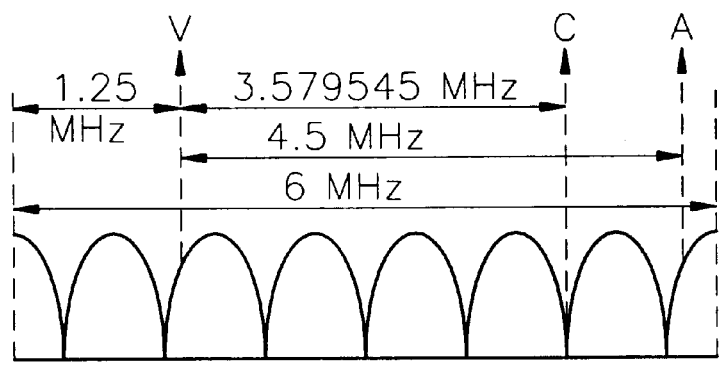

When an NTSC signal exists in an HDTV channel, the NTSC signal acts as an interference factor. In order to reduce the effect of the interference, a receiver of a GA-VSB system uses an NTSC rejection filter (hereinafter referred to as comb filter) to remove the modulation carrier of the NTSC signal. FIGS. 5A and 5B show the structure and the frequency characteristics, respectively, of a comb filter 150. As shown in FIG. 5A, since the NTSC signal has a predetermined carrier frequency offset (about 0.89 MHz) with respect to the VSB signal, the same result is obtained as if the NTSC signal was modulated with the frequency offset in consideration of a base band region, under co-channel circumstance for simultaneously broadcasting HDTV and NTSC. The NTSC signal energy is concentrated in the original DC components, that is, at the modulation carrier. Thus, a subtractor 154 of the comb filter 150 subtracts the delayed input data output by a 12-symbol delay 152 from the input data to remove modulation carrier components of the NTSC signal, thereby reducing the effect of the NTSC signal.

Whereas the original VSB signal has 8 levels {±7, ±5, ±3, ±1}, the output of the comb filter 150 has 16 levels {±14, ±12, ±10, ±8, ±6, ±4, ±2, 0}. Also, the comb filter 150 is positioned at the input of the TCM decoder, which provides the same effect that one memory of an encoder is added in an aspect of the TCM decoder. Thus, when the receiver uses the comb filter 150, the TCM decoder must decode 8-state data rather than 4-state data. Therefore, the TCM decoder of the GA-VSB system must have a structure capable of simultaneously decoding both 4-state and 8-state data. Also, the TCM decoder must be capable of coping with 12-symbol interleaving by the above-described encoder.

Next, in order to design the 8-state TCM decoder, the state table or trellis diagram for the 8-state structure must be obtained in advance. To this end, as shown in FIG. 6A, an 8-state TCM decoder can be constituted by combining the TCM encoder of FIG. 1 with the comb filter of FIG. 5A.

Figures 1A, 1B:
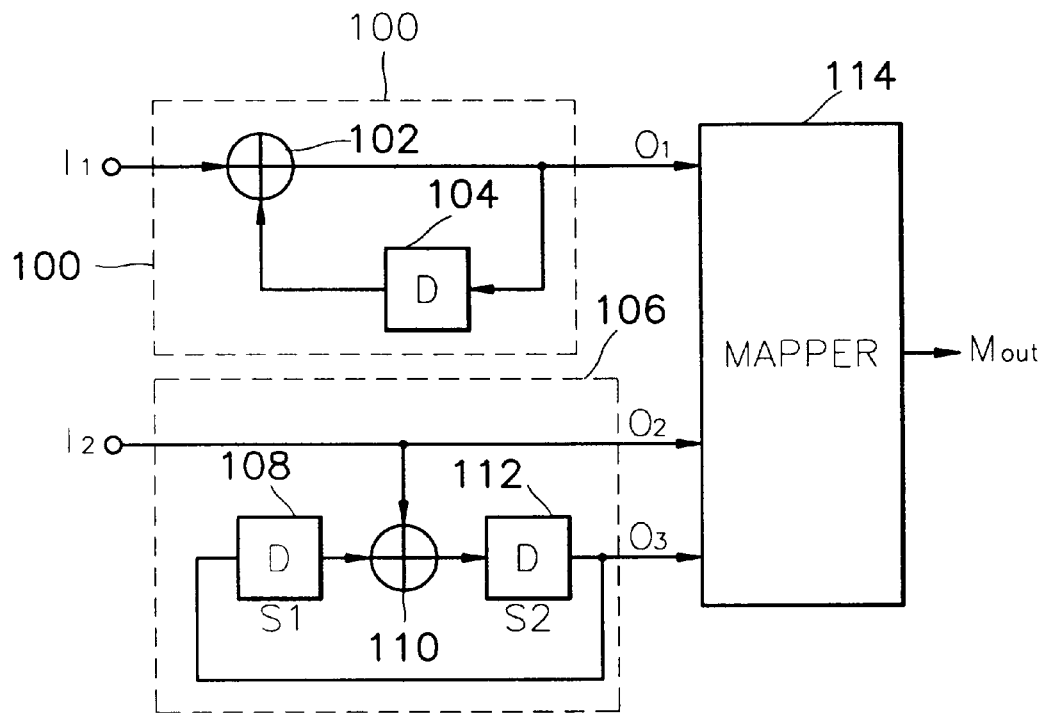
FIG. 1A is a diagram showing the structure of a trellis-coded modulation (TCM) encoder of a grand alliance vestigial side band (GA-VSB) system.
FIG. 1B is a table showing the input and output values of a mapper shown in FIG. 1A.
Figures 6A, 6B:
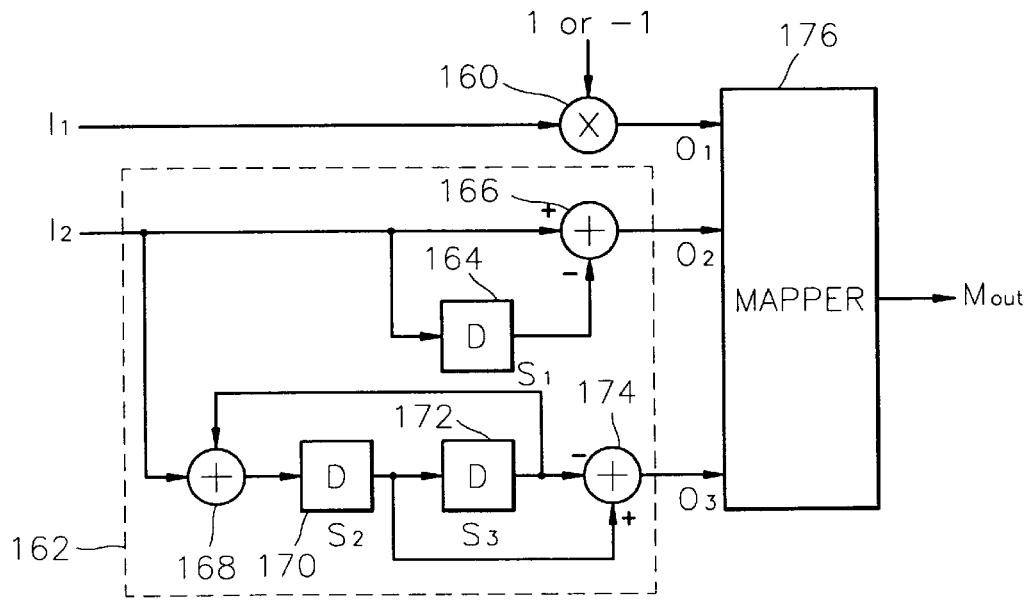
FIG. 6A shows the structure of an 8-state TCM encoder in which a TCM encoder and an NTSC rejection filter are connected, in order to help understanding of the present invention.
FIG. 6B is a table showing the input and output values of a mapper of FIG. 6A.

A precoder of the 8-state TCM encoder shown in FIG. 6A can be replaced by a multiplier 160 which multiplies the MSB ($I_1$) of the two bits input in parallel by 1 or −1, by combining the precoder 100 of FIG. 1 with the comb filter 150 of FIGS. 5A and 5B. Also, a convolution encoder 162 of the 8-state TCM encoder includes delay units 164, 170 and 172, subtractors 166 and 174 and an adder 168. The delay unit 164 for delaying the LSB ($I_2$) of the two bits input in parallel, the subtractor 166 subtracts the output of the delay unit 164 from the LSB ($I_2$), and the adder 168 adds the LSB ($I_2$) to the output of a delay unit 172. The delay unit 170 delays the output of the adder 168, the delay unit 172 delays the output of the delay 170 and feeds back the delayed result to the adder 168, and the subtractor 174 subtracts the output of the delay unit 172 from the output of the delay unit 170. The 8-state TCM encoder also includes a mapper 176 having the input and output values shown in FIG. 6B.

The operation of the 8-state TCM encoder shown in FIG. 6A will be described in the case when the previous state of the encoder is "01".

When the LSB ($I_2$) of the two bits input in parallel is "0", the next state becomes "011". At this time, the 2-bit output $O_2O_3$ of the convolution encoder 162 becomes "00". When the MSB ($I_1$) input to the multiplier 160 is "0", the output of the mapper 176 becomes "0(000)". On the contrary, when the MSB ($I_1$) input to the multiplier 160 is "1", the output of the mapper 176 becomes "−8(−100)" or "8(100)".

When the LSB ($I_2$) of the two bits input in parallel is "1", the next state becomes "101". At this time, the 2-bit output $O_2O_3$ of the convolution encoder 162 becomes "10". When the MSB ($I_1$) input to the multiplier 160 is "0", the output of the mapper 176 becomes "4(010)". On the contrary, when the MSB ($I_1$) input to the multiplier 160 is "1", the output of the mapper 176 becomes "−4(−110)" or "12(110)".

FIG. 7 is a state table of the 8-state TCM encoder of FIG. 6A. In order to build a TCM decoder of simple hardware, that is, in order to provide transition shared by the 4-state and the 8-state as shown in the trellis diagrams of FIGS. 12A and 12B, the previous state values and the next state values are modified into the values in the parenthesis. However, even though the state values are modified as above, the decoded data values are not changed.

Thus, in designing the structure of the TCM encoder of the GA-VSB system, the following two factors must be considered: one is 12-symbol interleaving by the TCM encoder and the other is the requirement for two structures of the decoder for the 4-state case and the 8-state case (due to the NTSC rejection filter). The block diagram of the TCM decoder of the GA-VSB system, which is conceptually designed based on the above considerations, is shown in FIG. 8.

Figure 8:
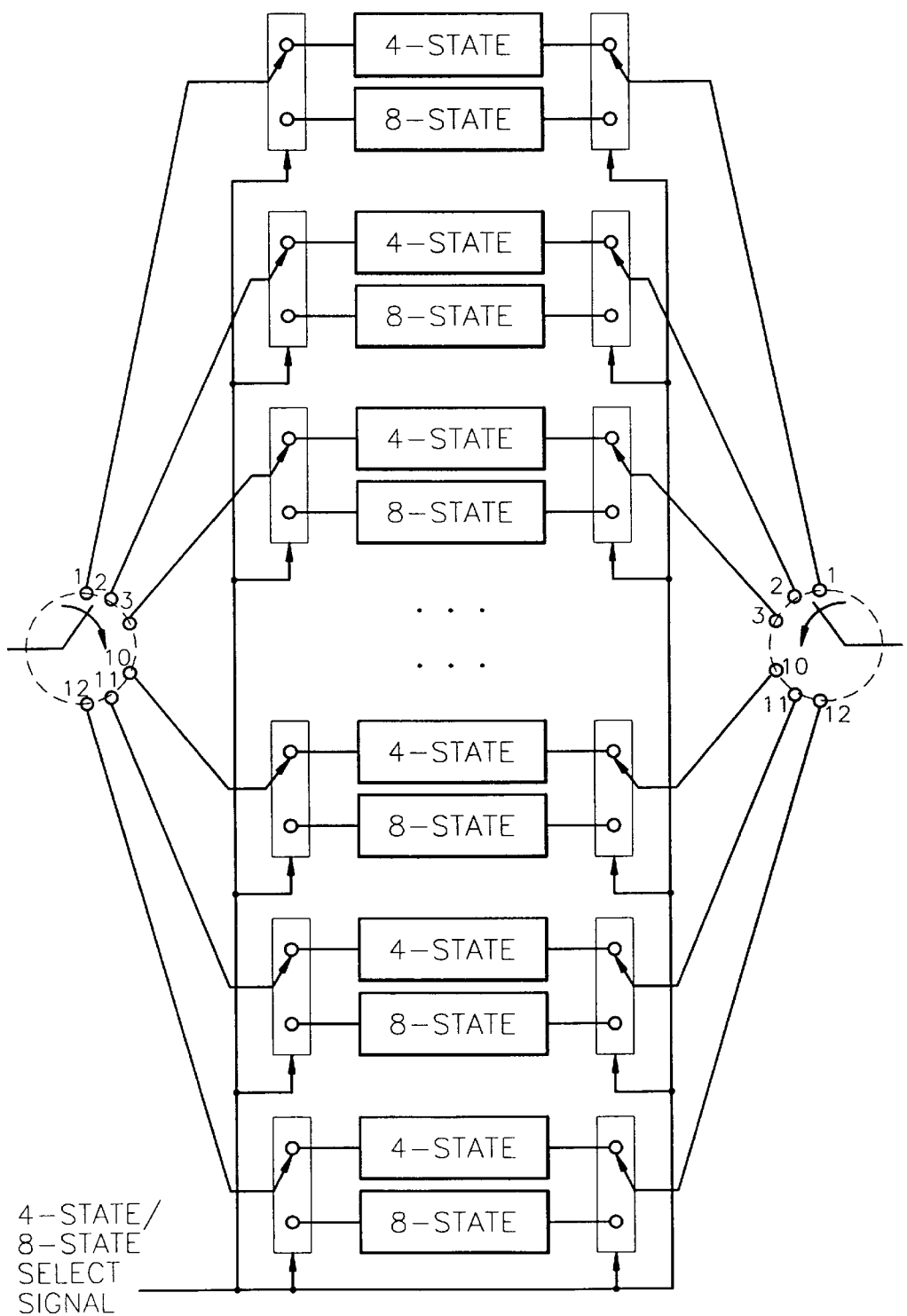
FIG. 8 is a schematic block diagram of a TCM encoder of a GA-VSB system.

In FIG. 8, twelve 4-state TCM decoders, each having a unit delay, and twelve 8-state TCM decoders, each having a unit delay have different state values and input symbol levels and provide the same decoding process. Thus, the TCM decoders for each state can be combined into one, and one decoder can be implemented through proper timing control corresponding to 12-symbol interleaving.

Thus, the TCM decoder of the present invention is capable of being applied as both a 4-state and an 8-state decoder, and the twelve decoders are constituted as one decoder. Also, the TCM decoder of a GA-VSB system is constituted in consideration of a segment sync signal and a field sync signal.

Hereinafter, a preferred embodiment of a TCM decoder of an HDTV receiver, and a decoding method thereof, according to the present invention, will be described with reference to the appended drawings.

Figure 9:
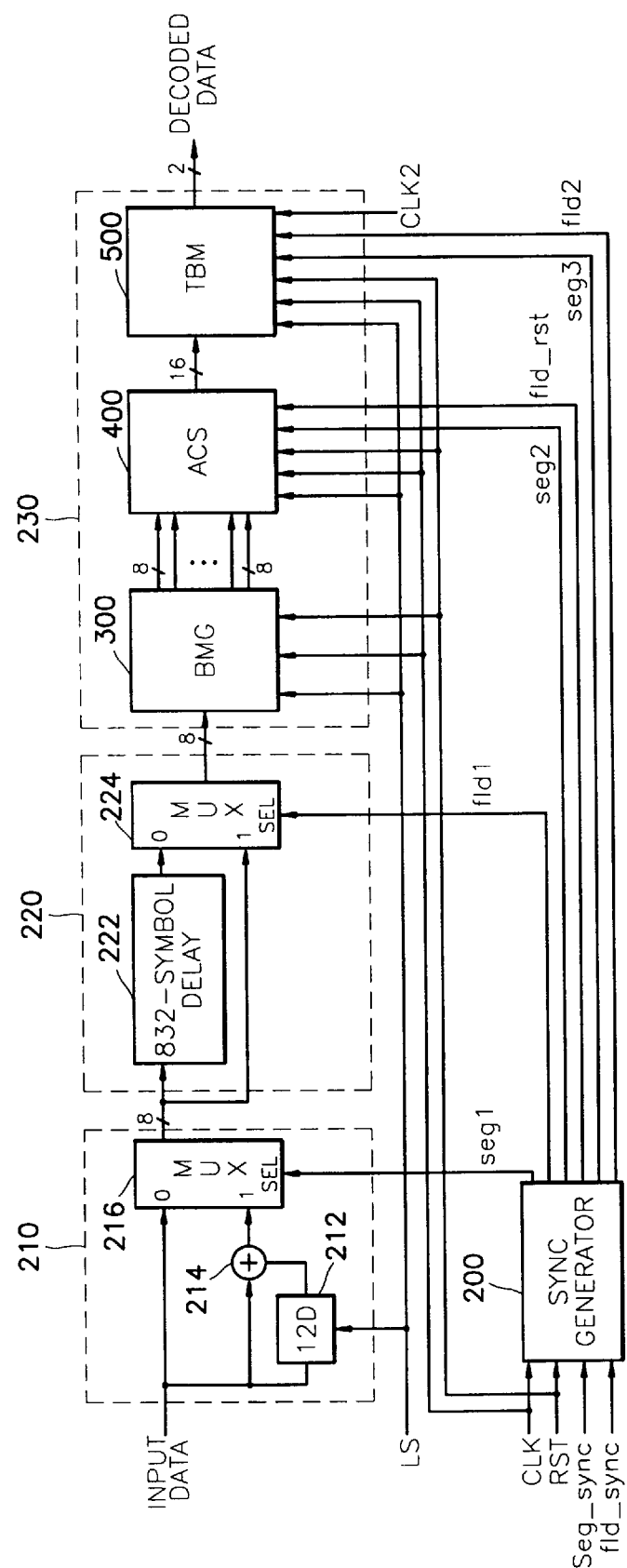
FIG. 9 is a block diagram of a TCM encoder according to a preferred embodiment of the present invention.

FIG. 9 is a block diagram of an entire TCM decoder according to a preferred embodiment of the present invention. In FIG. 9, input data is applied to an input port of a 12-symbol delay (or 12D) 212, an input port of an adder 214 and a first input port 0 of a multiplexer (MUX) 216 in a segment sync suspension unit 210 for directly connecting the data before and after the twelve symbols from the segment sync in order to remove interference by the NTSC signal. The other input port of the adder 214 is connected to an output port of the 12-symbol delay 212, and an output port thereof is connected to a second input port 1 of the multiplexer 216.

In a field delay 220 for connecting the data of the data segments just before and after the field sync segment during the decoding, an input port of an 832-symbol delay 222 is connected to the output port of the multiplexer 216, an output port of the 832-symbol delay 222 is connected to a first input port 0 of a multiplexer 224, and a second input port 1 thereof is connected to the output port of the multiplexer 216. In a Viterbi decoder 230 for Viterbi-decoding the data output by the field delay 220, an input port of a branch-metric generator (BMG) 300 is connected to an output port of the multiplexer 224, and a plurality of output ports of the BMG 300 are connected respectively to a plurality of input ports of an addition-comparison selector (ACS) 400. An input port of a trace-back memory (TBM) 500 is connected to an output port of the addition-comparison selector 400, and the final decoded data is output from an output port of the TBM 500.

A symbol clock CLK and a system reset signal RST are applied to a sync generator 200, the BMG 300, the ACS 400 and the TBM 500. A 4-state/8-state selection signal LS is applied to the segment sync suspension unit 210, the BMG 300, the ACS 400 and the TBM 500. Additionally, a clock signal CLK2 having twice the frequency of the symbol clock CLK is applied to the TBM 500. Here, the 4-state/8-state selection signal LS represents whether or not the input data has passed through the comb filter 150. That is, the LS is logic high to represent the 8-state condition, and the LS is logic low to represent the 4-state condition.

A segment sync timing signal seg_sync (see waveform A in FIG. 10) and a field sync timing signal fld_sync (see waveform E in FIG. 10) are applied to the input ports of the sync generator 200. A first segment sync control signal seg1 (see waveform B in FIG. 10) output from a first output port of the sync generator 200 is applied to a selection port SEL of the multiplexer 216. A first field sync control signal fld1 (see waveform F in FIG. 10) output from a second output port is applied to a selection port SEL of the multiplexer 224. A second segment sync control signal seg2 (see waveform C in FIG. 10) and a field reset signal fld_rst (see waveform H in FIG. 10), which are output from third and fourth output ports, respectively, are applied to control ports of the ACS 400. A third segment sync control signal seg3 (see waveform D in FIG. 10) and a second field sync signal fld2 (see waveform G in FIG. 10), which are output from fifth and sixth output ports, are applied to control ports of the TBM 500.

The operation of the TCM decoder shown in FIG. 9 will be described.

Figure 3:
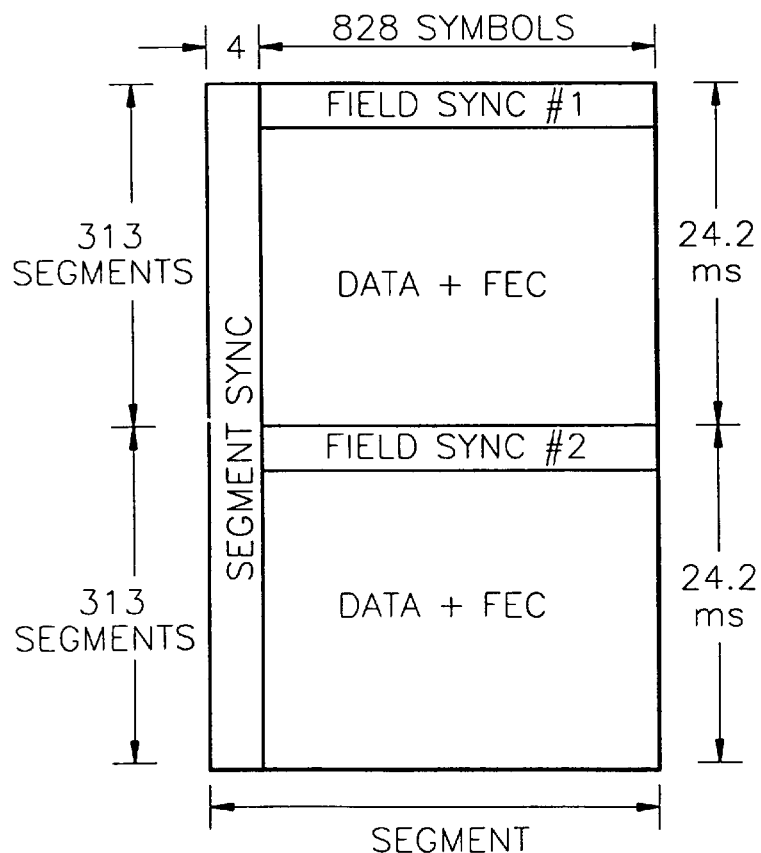
FIG. 3 illustrates a data frame format of the GA-VSB system.
Figure 4:
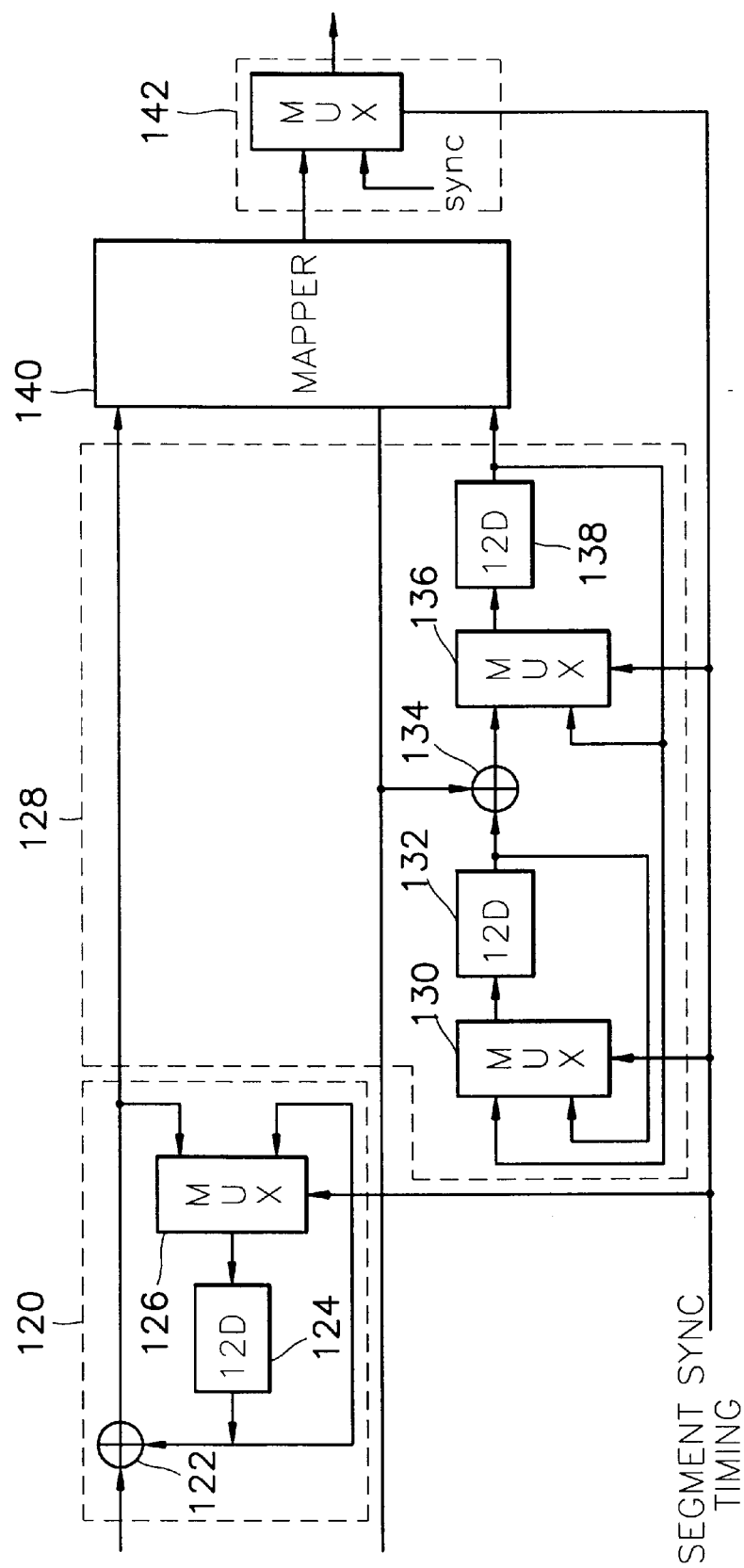
FIG. 4 is a circuit diagram showing the entire structure of the general TCM encoder in consideration of segment/field sync.

First, as shown in FIG. 3, the GA-VSB system has 626 segment sync signal of 4-symbol length and 2 field sync signal of 828-symbol length within a transmission frame. The segment sync signal and the field sync signal are not TCM-coded, so the TCM decoder must perform an extra process for these sync signals. If there is no process for the segment sync signal or the field sync signal, a symbol error rate of about $10^{-6}$ occurs even when no errors exist.

There is no problem if a receiver does not use the comb filter 150 of FIG. 5A; i.e., in the 4-state case. However, if a receiver uses the comb filter 150, i.e., in the 8-state case, the comb filter 150 operates during the segment sync period, so that the segment sync data affects the data 12 symbols before and after the segment sync. Thus, in the 8-state where the comb filter is used, a process for directly connecting the data twelve symbols before the segment sync with the data twelve symbols after the segment sync is required. This process is performed by the segment sync suspension unit 210. The segment sync suspension unit 210 operates only in 8-state conditions, during a 4-symbol period after the twelve symbols from the segment sync, and the remaining data is unprocessed.

The operation of the segment sync suspension unit 210 will be described in connection with the comb filter 150 of FIG. 5A, using numerical formulae. It is assumed that the inputs of the comb filter 150 are s1, s2, s3, s4, b5, b6, b7, b8, b9, b10, b11, b12, c1, . . . , c11 and c12. Here, s1, s2, s3 and s4 are the segment sync data. Assuming that twelve data symbols stored in the 12-symbol delay 152 of the comb filter 150 are a1, a2, . . . , a11 and a12, the outputs of the comb filter 150 become (s1-a1), (s2-a2), (s3-a3), (s4-a4), (b5-a5), . . . , (b12-a12), (c1-a1), (c2-a2), (c3-a3), (c4-a4), (c5-b5), . . . , (c11-b11) and (c12-b12).

Also, the multiplexer 216 of the segment sync suspension unit 210 selects the output of the adder 214 only during the 4-symbol period after the twelve symbols from the segment sync, thus (s1-a1), (s2-a2), (s3-a3), (s4-a4), (b5-a5), . . . , (b12-a12), (c1-a1), (c2-a2), (c3-a3), (c4-a4), (c5-b5), . . . , (c11-b11) and (c12-b12) are selected as the output. As a result, the twelfth data symbol after the segment sync can be directly connected with the twelfth symbol data before the segment sync, thereby removing the effect of the segment sync on the data.

Figure 10:
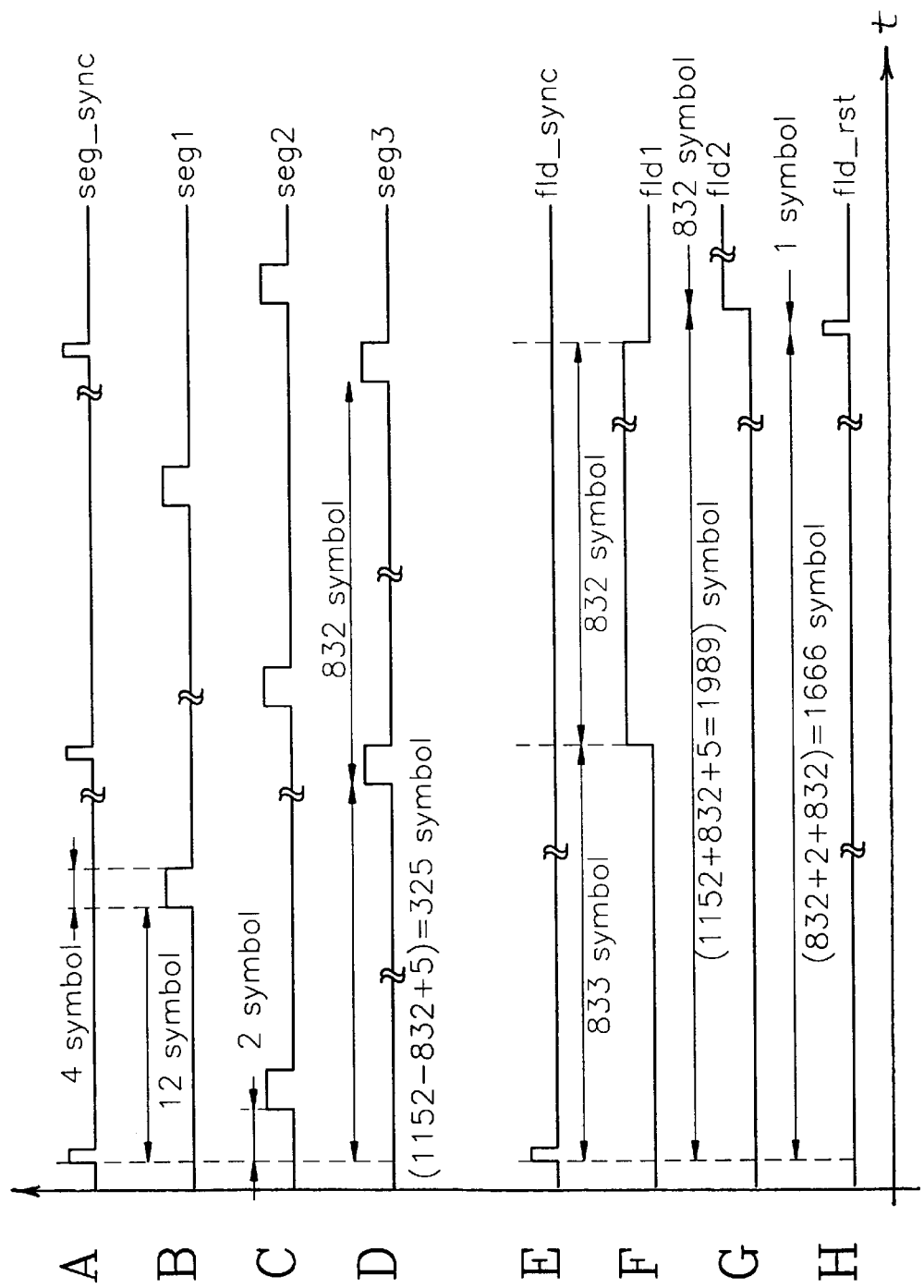
FIG. 10 is a waveform timing diagram showing waveforms A through H which correspond to input and output signals of a sync generator shown in FIG. 9.

The sync generator 200 receives the segment sync timing signal seg_sync of one symbol length, shown at waveform A in FIG. 10, which represents the starting point of the segment sync signal, and applies the first segment sync control signal seg1 (see waveform B in FIG. 10), which is logic high only during the 4-symbol period after twelve symbols from the segment sync, to the multiplexer 216. The multiplexer 216 selects the output of the adder 214 for adding the input data to the data delayed by the 12-symbol delay 212, during the logic high period of the first segment sync control signal seg1, and the input data unprocessed during the remaining period.

On the other hand, as in case of the segment sync signal, when the comb filter 150 is used during the field sync period, the first twelve symbols of the data segment just after the field sync segment are affected by the field sync of the last twelve symbols of the field sync segment. In order to eliminate this effect, it is prescribed that the last twelve symbols of the field sync segment are filled by copying the last twelve symbols of the data segment just before the field sync segment during coding. Thus, even though a receiver adopts a comb filter, the data segment just before the field sync segment is smoothly connected with the data segment just after.

However, while the data flows forward in time sequence in the TCM encoder, the data in the TCM decoder flows in both forward and backward directions, and the length of the field sync segment is greater than the size of the trace-back memory used for the trace-back. Thus, it is impossible to eliminate the effect of the field sync signal only by holding the data as in the encoder.

If the effect of the field sync signal is not eliminated, a symbol error rate of about $10^{-6}$ occurs even in the absence of noise. Specifically, the symbol errors are concentrated on the data segment just before the field sync segment. It is unfavorable that the errors occur in such a burst, thus compensation for the errors is required. For the compensation, the following two facts must be born in mind. The first fact is that it is basically impossible to eliminate the effect of the field sync signal by controlling timing. The second fact is that the coding is performed by connecting the data segments just before and after the field sync segment. Thus, the decoding can be achieved without effect by the field sync signal, by using the data of the data segment just after the field sync segment when decoding the data segment just before the field sync segment.

To this end, the field delay 220 having the 832-symbol delay which is placed at the input of the Viterbi decoder 230, delays the normal data and then outputs the delayed data to the Viterbi decoder 230. When the delayed field sync segment is output to the Viterbi decoder 230, that is, the data segment just after the field sync segment is input to the 832-symbol delay 222 of the field delay 220, the Viterbi decoder 230 receives the data of the data segment just after the field sync segment input to the 832-symbol delay 222. As a result, the decoding of the data of the data segment just before the field sync segment can be performed without effect by the field sync signal.

That is, the 832-symbol delay 222 of the field delay 220 provides the output of the segment sync suspension unit 210 to the first input port 0 of the multiplexer 224 delayed by 832 symbols, in other words, one data segment interval, and provides the output of the segment sync suspension unit 210 directly to the second input port 1 of the multiplexer 224.

Here, the sync generator 200 receives the field sync timing signal fld_sync of one symbol length indicating the starting point of the field sync signal, as shown at waveform E in FIG. 10, and applies the first field sync control signal fld1 which is logic high during 832 symbols (see waveform F in FIG. 10) to the selection port SEL of the multiplexer 224 when 832 symbols have passed after the field sync timing signal.

The multiplexer 224 selects the output of the multiplexer 216 of the segment sync suspension delay 210, which is input to the second input port 1, when the field sync control signal fld1 is logic high, that is, in the field sync period, and selects the output of the 832-symbol delay 222, which is input to the first input port 0, when the field sync control signal fld1 is a logic low. This is to achieve complete decoding by connecting the data segments before and after the field sync segment, in consideration of the TCM encoder in which the data is held in the field sync segment without coding and the coding is performed again when data of the data segment just after the field sync segment is input.

The BMG 300 of the Viterbi decoder 230 calculates the Euclidian distance which represents the likelihood distance between the input symbol output from the field delay 220 and a reference signal. The ACS 400 adds the branch-metrics input at each state to the path metrics at that point according to the second segment sync control signal seg2 (see waveform C in FIG. 10) which is logic high during a 4-symbol period in consideration of its own delay (here, two symbols), and the field reset signal fld_rst in consideration of the 832-symbol delay of the field delay 220 and its own delay (here, 2 symbols), and determines the survivor having the least path metric among the merged paths.

The trace-back memory 500 stores information about the survivor, provided from the ACS 400, and performs restoration into the original symbol by performing the trace-back at every period of a predetermined number of symbols (here, twelve symbols), according to the third segment sync control signal seg3 (see waveform D in FIG. 10) in consideration of its own delay (here, 1152−832+5=325 symbols) and the second field sync control signal fld2 of 832-symbol period (see waveform G in FIG. 10) in consideration of its own delay (here, 1152+832+5=1989 symbols). Then, the trace-back memory 500 outputs the decoded data.

Figure 11:
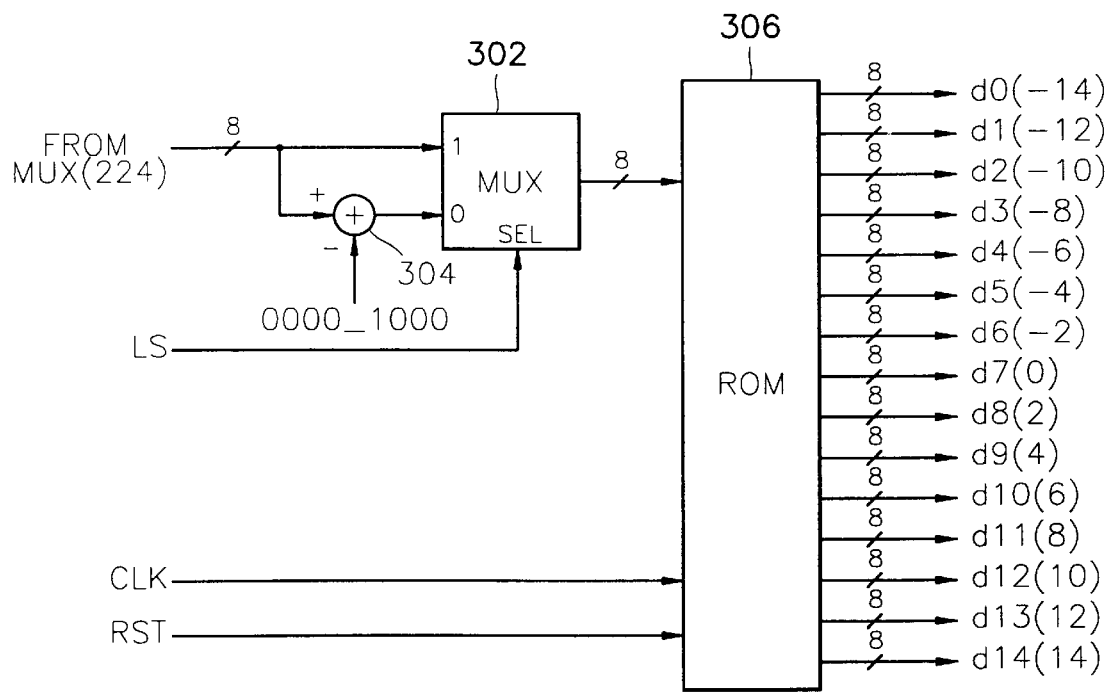
FIG. 11 is a detailed circuit diagram of a branch-metric generator of FIG. 9.

FIG. 11 is a detailed circuit diagram of the BMG 300 which calculates the Euclidean distance between the input signal and the reference signal, wherein the reference signal is an 8-level signal in the 4-state case, and a 15-level signal in the 8-state case. A method of calculating the Euclidean distance is to take the absolute value of the difference between the input symbol and the reference signal, or to take the square of the difference. Taking the square of the difference between the input symbol and the reference signal further discriminates two values, and thus the present invention adopts the method of taking the square of the difference. Also, since the circuit becomes complicated if a structure of directly calculating the Euclidean distance is used, a read only memory (ROM) is adopted.

Thus, in case of the 8-state, that is, when a 4-state/8-state selection signal LS of logic high is input to the multiplexer 302, a ROM 306 outputs the square of the difference between the previously stored 15 levels {±14, ±12, ±10, ±8, ±6, ±4, ±2, 0} and the input data output from the multiplexer 224 of the field delay 220 of FIG. 9 via the first input port 1 of the multiplexer 302, as the branch-metric of each state. Here, since the output of the ROM 306 is limited to unsigned 8 bits, the branch-metric is mapped to 255 if the calculated branch-metric is over 255. That is, the ROM 306 operates according to the symbol clock CLK, and is reset by a system reset signal (AST). The output d0 of the ROM 306 is the branch-metric between the input data and the reference level −14, the output d1 is the branch-metric between the input data and the reference level −12, . . . , the output d13 is the branch-metric between the input data and the reference level 12, and the output d14 is the branch-metric between the input data and the reference level 14. In FIG. 11, the numbers in parentheses represent each reference level.

Also, in the 4-state case, that is, when the 4-state/8-state selection signal LS of logic low is input to the multiplexer 302, the reference levels are {−7, −5, −3, −1, 1, 3, 5, 7} unlike in the 8-state case. Thus, "1" (corresponding to (08)$_{HEX}$) is subtracted from the input data output from the multiplexer 224 by a subtractor 304 and then the output of the ROM 306, corresponding to levels {−8, −6, −4, −2, 0, 2, 4, 6}, are obtained via the multiplexer 302, resulting in the branch-metrics for the 4-state.

The ACS 400 of FIG. 9 generates new path metrics by adding the branch-metrics of the input symbols at each branch converging on each state to the path metrics up to the previous state, and compares the path metrics of the converging paths (new path metrics) to select the survivor having the least path metric. The TCM decoder of the GA-VSB system must be capable of decoding both 4-state and 8-state data. Thus, in order to reduce the number of gates required for an integrated circuit (ASIC), the function block of the ACS 400 must be shared.

Figure 2:
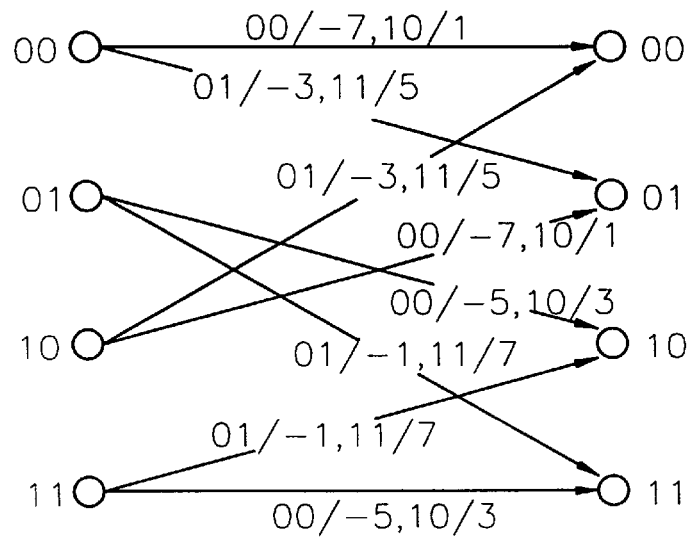
FIG. 2 is a trellis diagram of the TCM encoder of FIGS. 1A and 1B.
Figure 12A:
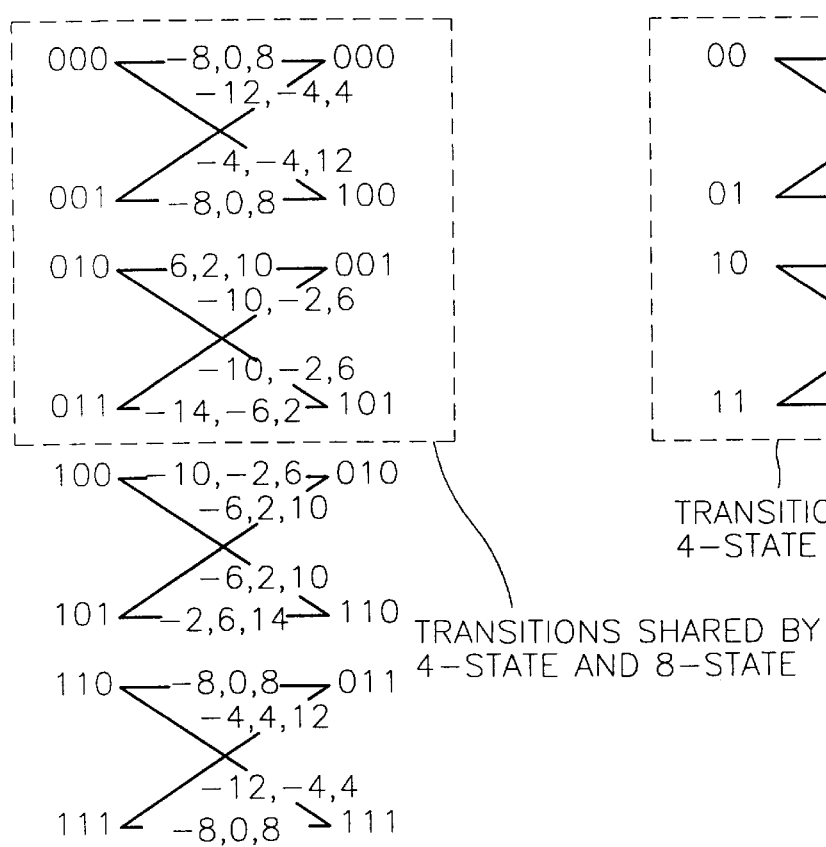
FIGS. 12A and 12B are, respectively, 8-state and 4-state trellis diagrams according to the present invention.
Figure 12B:
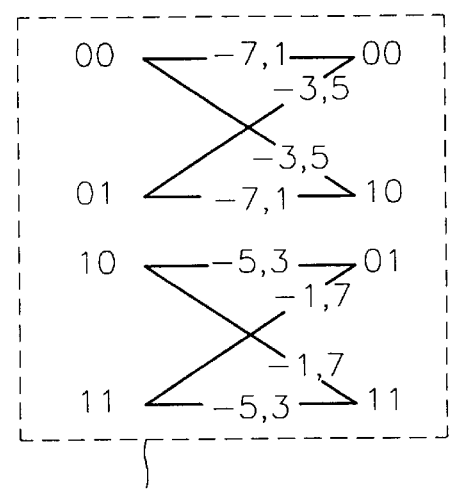

To this end, when the 8-state transition structure shown in FIG. 7 is changed into the transition state designated in the parenthesis, the 8-state trellis diagram of FIG. 12A can be obtained, and the 4-state transition structure shown in FIG. 2 must be changed into the trellis diagram of FIG. 12B.

In FIGS. 12A and 12B, the portion enclosed by the dashed line represents the state transition structure shared by the 8-state and the 4-state structures. For example, the paths from the state 000 to the state 000 in the 8-state structure can be shared with those from the state 00 to the state 00 in the 4-state structure, and the branch-metrics of the reference levels −7 and 1 in the 4-state can be shared with those of the reference levels −8 and 2 by subtracting "1" from the input data using the subtractor 304. The ACS 400 obtained on the basis of the trellis diagrams of FIGS. 12A and 12B is shown in detail in FIG. 13.

Figures 13A, 13B:
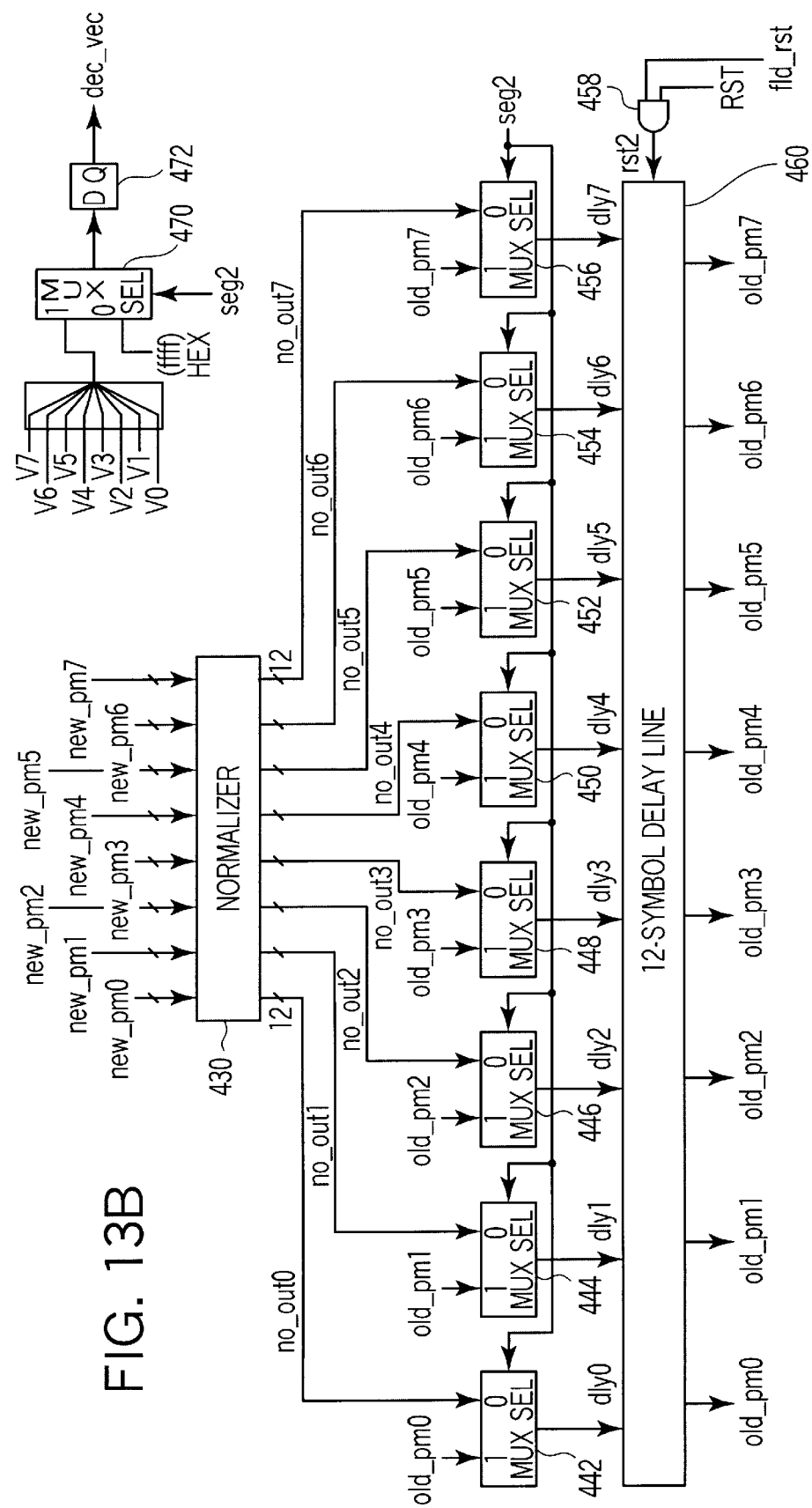
FIG. 13 is a detailed circuit diagram of an addition-comparison selector of FIG. 9.

In FIG. 13, first through fourth survivor deciders 402, 404, 410 and 412 have a structure shared by the 4-state and the 8-state cases based on the trellis diagrams of FIGS. 12A and 12B, and each receive the 4-state/8-state selection signal LS. Also, fifth through eighth survivor deciders 414–420 have an 8-state structure.

The first survivor decider 402 receives the path metrics old_pm0 accumulated in the previous state 000 and the path metrics old_pm1 accumulated in the previous state 001, and also receives branch-metrics d3, d11 and d7 with respect to the reference levels −8, 8 and 0 toward the current state 000 from the previous state 000 and the branch-metrics d9, d1 and d5 with respect to the reference levels 4, −12 and −4 toward the current state 000 from the previous state 001, which are output from the BMG 300. Thereby, the first survivor decider 402 decides on a survivor having the least path metric among all paths toward the current state 000 and outputs information V0 about the previous state of the path decided as the survivor at the current state 000 and a new path metric new_pm0.

The second survivor decider 404 receives the path metrics old_pm0 accumulated in the previous state 000 and the path metrics old_pm1 accumulated in the previous state 001, and also receives branch-metrics d5, d13 and d9 with respect to the reference levels −4, 12 and 4 toward the current state 100 from the previous state 000 and the branch-metrics d3, d11 and d7 with respect to the reference levels −8, 8 and 0 toward the current state 100 from the previous state 001, which are output from the BMG 300. Thereby, the second survivor decider 404 decides on a survivor having the least path metric among all paths toward the current state 100 and outputs information V4 about the previous state of the path decided as the survivor at the current state 100 and a new path metric new_pm4.

The third survivor decider 410 receives the previous path metric old_pm2 or the previous path metric old_pm4 selected by a multiplexer 406, and the fourth survivor decider 412 receives the previous path metric old_pm3 or the previous path metric old_pm5 selected by a multiplexer 408, to share the 4-state and 8-state properties as shown in FIG. 12.

That is, in the 8-state case, the multiplexers 406 and 408 select the path metric old_pm2 accumulated at the previous state 010 and the path metric old_pm3 accumulated in the previous state 011, respectively, which are input to each first input port 1, according to a 4-state/8-state selection signal LS. In the 4-state case, the multiplexers 406 and 408 select the path metric old_pm4 accumulated in the previous state 100 and the path metric old_pm5 accumulated in the previous state 101, respectively, which are input to each second input port 0.

In the 8-state case, the third survivor decider 410 receives the previous path metrics old_pm2 and old_pm3 which are selected by the multiplexers 406 and 408, respectively, and in the 4-state, receives the previous path metrics old_pm4 and old_pm5 which are selected by the multiplexers 406 and 408, respectively. The third survivor decider 410 also receives branch-metrics d4, d12 and d8 with respect to the reference levels −6, 10 and 2 toward the current state 001 from the previous state 010 and the branch-metrics d10, d2 and d6 with respect to the reference levels 6, −10 and −2 toward the current state 001 from the previous state 011, which are output from the BMG 300. Thereby, the third survivor decider 410 decides on a survivor having the least path metric among all paths toward the current state 001 and outputting information V1 about the previous state of the path decided as the survivor at the current state 001 and a new path metric new_pm1.

In the 8-state case, the fourth survivor decider 412 receives the previous path metrics old_pm2 and old_pm3 which are selected by the multiplexers 406 and 408, respectively, and in the 4-state, receives the previous path metrics old_pm4 and old_pm5 which are selected by the multiplexers 406 and 408, respectively. The fourth survivor decider 412 also receives branch-metrics d10, d2 and d6 with respect to the reference levels −6, 10 and 2 toward the current state 101 from the previous state 010 and the branch-metrics d8, d0 and d4 with respect to the reference levels 2, −14 and −6 toward the current state 101 from the previous state 011, which are output from the BMG 300. Thereby, the fourth survivor decider 412 decides on a survivor having the least path metric among all paths toward the current state 101 and outputs information V5 about the previous state of the path decided as the survivor at the current state 101 and a new path metric new_pm5.

The fifth survivor decider 414 receives the path metric old_pm4 accumulated in the previous state 100 and the path metric old_pm5 accumulated in the previous state 101, and also receives branch-metrics d2, d10 and d6 with respect to the reference levels −10, 6 and −2 toward the current state 010 from the previous state 100 and the branch-metrics d4, d12 and d8 with respect to the reference levels 31 6, 10 and 2 toward the current state 010 from the previous state 101, which are output from the BMG 300. Thereby, the fifth survivor decider 414 decides on a survivor having the least path metric among all paths toward the current state 010 and outputs information V2 about the previous state of the path decided as the survivor at the current state 010 and a new path metric new_pm2.

The sixth survivor decider 416 receives the path metric old_pm4 accumulated in the previous state 100 and the path metric old_pm5 accumulated in the previous state 101, and also receives branch-metrics d4, d12 and d8 with respect to the reference levels −6, 10 and 2 toward the current state 110 from the previous state 100 and the branch-metrics d6, d4 and d10 with respect to the reference levels −2, −6 and 6 toward the current state 110 from the previous state 101, which are output from the BMG 300. Thereby, the sixth survivor decider 416 decides on a survivor having the least path metric among all paths toward the current state 110 and outputs information V6 about the previous state of the path decided as the survivor at the current state 110 and a new path metric new_pmb 6.

The seventh survivor decider 418 receives the path metric old_pm6 accumulated in the previous state 110 and the path metric old_pm7 accumulated in the previous state 111, and also receives branch-metrics d3, d11 and d7 with respect to the reference levels −8, 8 and 0 toward the current state 011 from the previous state 110 and the branch-metrics d5, d13 and d9 with respect to the reference levels −4, 12 and 4 toward the current state 011 from the previous state 111, which are output from the BMG 300. Thereby, the seventh survivor decider 418 decides on a survivor having the least path metric among all paths toward the current state 011 and outputs information V3 about the previous state of the path decided as the survivor at the current state 011 and a new path metric new_pm3.

The eighth survivor decider 420 receives the path metric old_pm6 accumulated in the previous state 110 and the path metric old_pm7 accumulated in the previous state 111, and also receives branch-metrics d1, d9 and d5 with respect to the reference levels −12, 4 and −4 toward the current state 111 from the previous state 110 and the branch-metrics d3, d11 and d7 with respect to the reference levels −8, 8 and 0 toward the current state 111 from the previous state 111, which are output from the BMG 300. Thereby, the eighth survivor decider 420 decides on a survivor having the least path metric among all paths toward the current state 111 and outputting information V7 about the previous state of the path decided as the survivor at the current state 111 and a new path metric new_pm7.

Thus, the survivor deciders 402, 404, 410, 412, 414, 418 and 420 receive the previous path metrics old_pm0 through old_pm7 which have been normalized by a normalizer 430 and delayed by a 12-symbol delay line 460 and the branch-metrics dk (k=0, 1, . . . , 14) generated by the BMG 300 according to the trellis diagrams of FIGS. 12A and 12B, to decide on a survivor having the least path metric among all paths leading to the state (= node) at an arbitrary stage (= time), and output information Vk1 (k=0, 1, . . . , 7) about the previous state of the path which is decided to be the survivor at each current state and new path metrics new_pm0 through new_pm7 at the time.

On the other hand, since the path metric is limited to twelve bits, normalization is required in order to prevent overflow. Thus, the normalizer 430 checks the MSB of each of the new path metrics new_pm0 through new_pm7 output from the survival path deciders 402, 404, 410, 412, 414, 416, 418 and 420. Here, if any of the MSBs are equal to "1", all eight path metrics are shifted to the right by one bit, thereby outputting normalized path metrics no_out0 through no_out7.

The multiplexers 442 through 456 select the normalized path metrics no_out0 through no_out7 input to each first input port 0 according to the second segment sync control signal seg2 (see waveform C in FIG. 10), that is, at times other than the segment sync period (seg2 is a logic "low"), and then the 12-symbol delay line 460 delays the selected normalized path metrics no_out0 through no_out7 to generate previous path metrics old_pm0 through old_pm7. On the other hand, during the segment sync period (seg2 is a logic "high"), the previous path metrics old_pm0 through old_pm7 fed back each second input port 1 after being delayed by the 12-symbol delay line 460 are selectively output to the 12-symbol delay line 460. Here, the reason why the 12-symbol delay line 460 delays the outputs of the multiplexers 442 through 456 is to cope with the 12-symbol interleaving in the TCM encoder. Also, the 12-symbol delay line 460 is reset according to the result of an AND operation on the field reset signal fld_rst (see waveform H in FIG. 10) and the system reset signal RST, at the ending point of the field sync signal. It is ideal to completely store the content of the 12-symbol delay line 460 at the starting point of the field sync segment and then reload the stored content when the data segment next to the field sync segment starts. However, such a process requires the 12-symbol delay line 460 to have 96 (12×8) 12-bit registers, thus about 8,000 gates are required. However, even though all the pass metrics stored in the 12-symbol delay line 460 are reset, correct paths are usually found if the damage of the data is not severely damaged.

The multiplexer 470 selects 2-bit previous state information V0 through V7 of each state, output from the survivor deciders 402, 404, 410, 412, 414, 416, 418 and 420 at times other than the segment sync period according to the second segment sync signal seg2, and selects a hexadecimal number (ffff)$_{HEX}$ during the segment sync period, and outputs the signal selected by the multiplexer 470 is output as a decision vector dec_vector via a D flip-flop 472.

Figure 14:
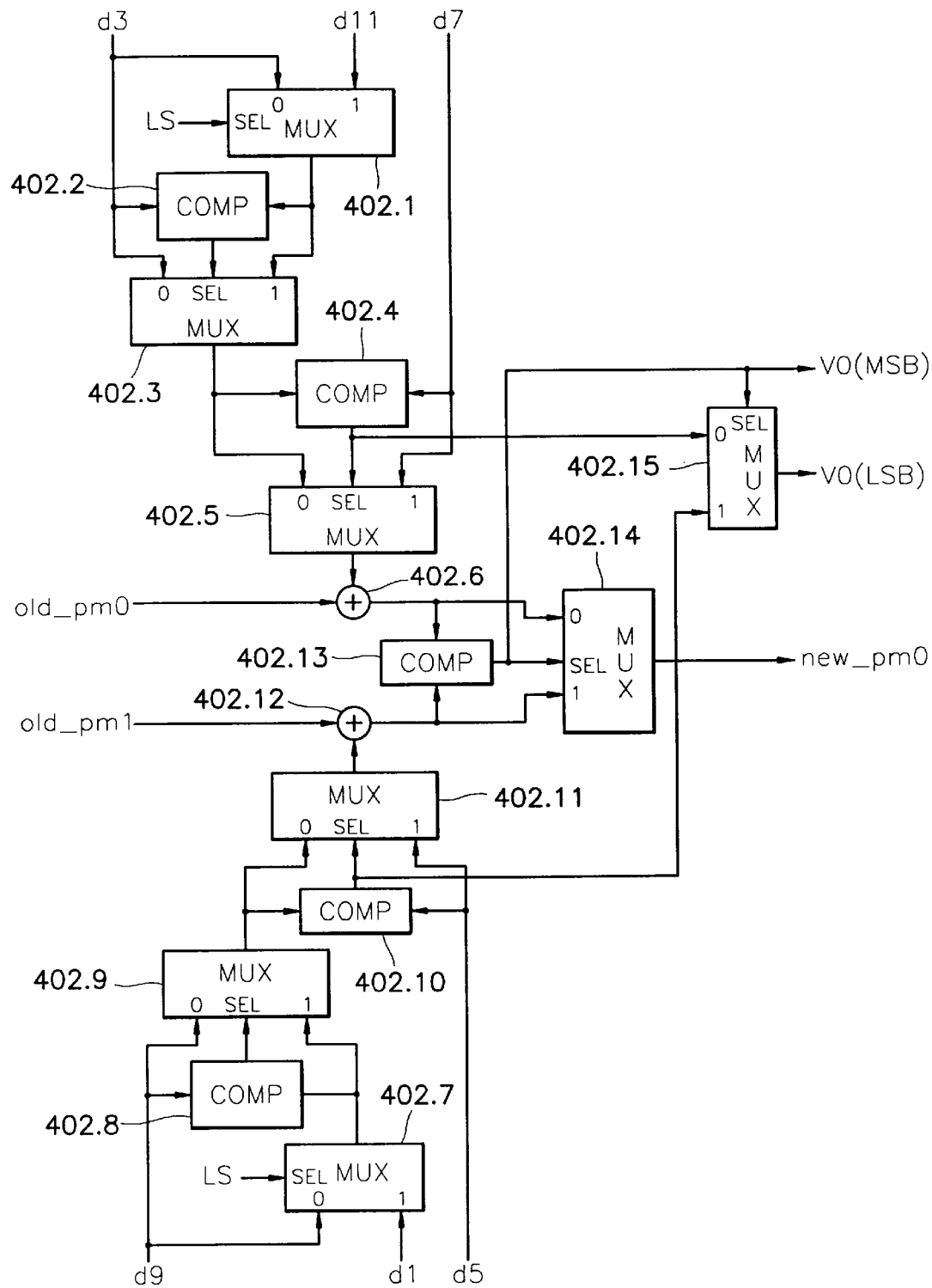
FIG. 14 is a detailed circuit diagram of a first survival path decider of FIG. 13.

FIG. 14 is a detailed circuit diagram of the first survivor decider 402 of FIG. 13, which shares the 8-state case and 4-state case. In FIG. 14, a multiplexer 402.1 selects a branch-metric d11 input to the first input port 1 when the 4-state/8-state selection signal LS is in a logic "high" state (8-state), and selects a branch-metric d3 input to the second input port 0 in a logic "low" state. The comparator COMP 402.2 compares the input branch-metric d3 with the branch-metric selected by the multiplexer 402.1 to output a comparison signal. A multiplexer 402.3 selects the branch-metric selected by the multiplexer 402.1, if the branch-metric selected by the multiplexer 402.1 is greater than the branch-metric d3, according to the comparison signal provided by the comparator 402.2. Otherwise, the multiplexer 402.3 selects the branch-metric d3.

A comparator 402.4 compares the branch-metric selected by the multiplexer 402.3 with an input branch-metric d7 to output a comparison signal. A multiplexer 402.5 selects the branch-metric d7, if the branch-metric d7 is greater than the branch-metric selected by the multiplexer 402.3, according to the comparison signal provided by the comparator 402.4. Otherwise, the multiplexer 402.5 selects the branch-metric selected by the multiplexer 402.3. That is, in the 8-state case, the branch-metric having the greatest value among the branch-metrics d3, d11 and d7 with respect to the reference levels −8, 8 and 0 toward the current state "000" from the previous state "000" is selected.

On the other hand, in the 4-state case, there are only two parallel paths from the previous state 00 to the current state 00. Thus, the branch-metrics input to the first and second input ports of the comparator 402.2 both become branch-metric d3, so that the output of the multiplexer 402.3 becomes the branch-metric d3. The multiplexer 402.5 selects the branch-metric having the greater value out of the branch-metrics d3 and d7 which correspond to the reference levels −7 and 1, respectively, toward the current state "00" from the previous state "00" in the trellis diagram.

An adder 402.6 adds the branch-metric selected by the multiplexer 402.5 to the path metric old_pm0 accumulated at the previous state 000, output from the 12-symbol delay line 460 of FIG. 13.

A multiplexer 402.7 selects the branch-metric d1 input to a first input port 1 when the 4-state/8-state selection signal LS is in a logic "high" (8-state), and selects a branch-metric d9 input to a second input port 0 in a logic "low" (4-state). A comparator 402.8 compares the branch-metric d9 with the branch-metric selected by the multiplexer 402.7 to output a comparison signal. A multiplexer 402.9 selects the branch-metric selected by the multiplexer 402.7, if the branch-metric selected by the multiplexer 402.7 is greater than the branch-metric d9, according to the comparison signal provided by the comparator 402.8. Otherwise, the multiplexer 402.9 selects the branch-metric d9. A comparator 402.10 compares the branch-metric selected by the multiplexer 402.9 with the input branch-metric d5 to output a comparison signal. A multiplexer 402.11 selects the branch-metric d5, if the branch-metric d5 is greater than the branch-metric selected by the multiplexer 402.9, according to the comparison signal provided by the comparator 402.10. Otherwise, the multiplexer 402.11 selects the branch-metric selected by the multiplexer 402.9. That is, in the 8-state case, the greatest branch-metric is selected among the branch-metrics d9, d1 and d5 with respect to the reference levels 4, −12 and −4 toward the current state "000" from the previous state "001". In the 4-state case, the greater branch-metric is selected among the branch-metrics d9 and d5 corresponding to the reference levels −7 and 1, respectively, toward the current state "00" from the previous state "01" in the trellis diagram.

The adder 402.12 adds the previous path metric old_pm1, output from the 12-symbol delay line 460 of FIG. 13, to the branch-metric selected by the multiplexer 402.11.

A comparator 402.13 compares the output of the adder 402.6 with the output of the adder 402.12 to output a comparison signal. A multiplexer 402.14 outputs the greater value among the output of the adder 402.6, input to the first input port 0 thereof, and the output of the adder 402.12 input to the second input port 1, according to the comparison signal provided by the comparator 402.13, as a new path metric new_pm0.

The comparison signal provided by the comparator 403.13 is output as the MSB of information V0 representing the survival path information of the current state "000", and the multiplexer 402.15 outputs the output of the comparator 402.4 or the output of the comparator 402.10 as the LSB of information V0 representing parallel path information of the selected survival path according to the comparison signal provided by the comparator 402.13.

Figure 15:
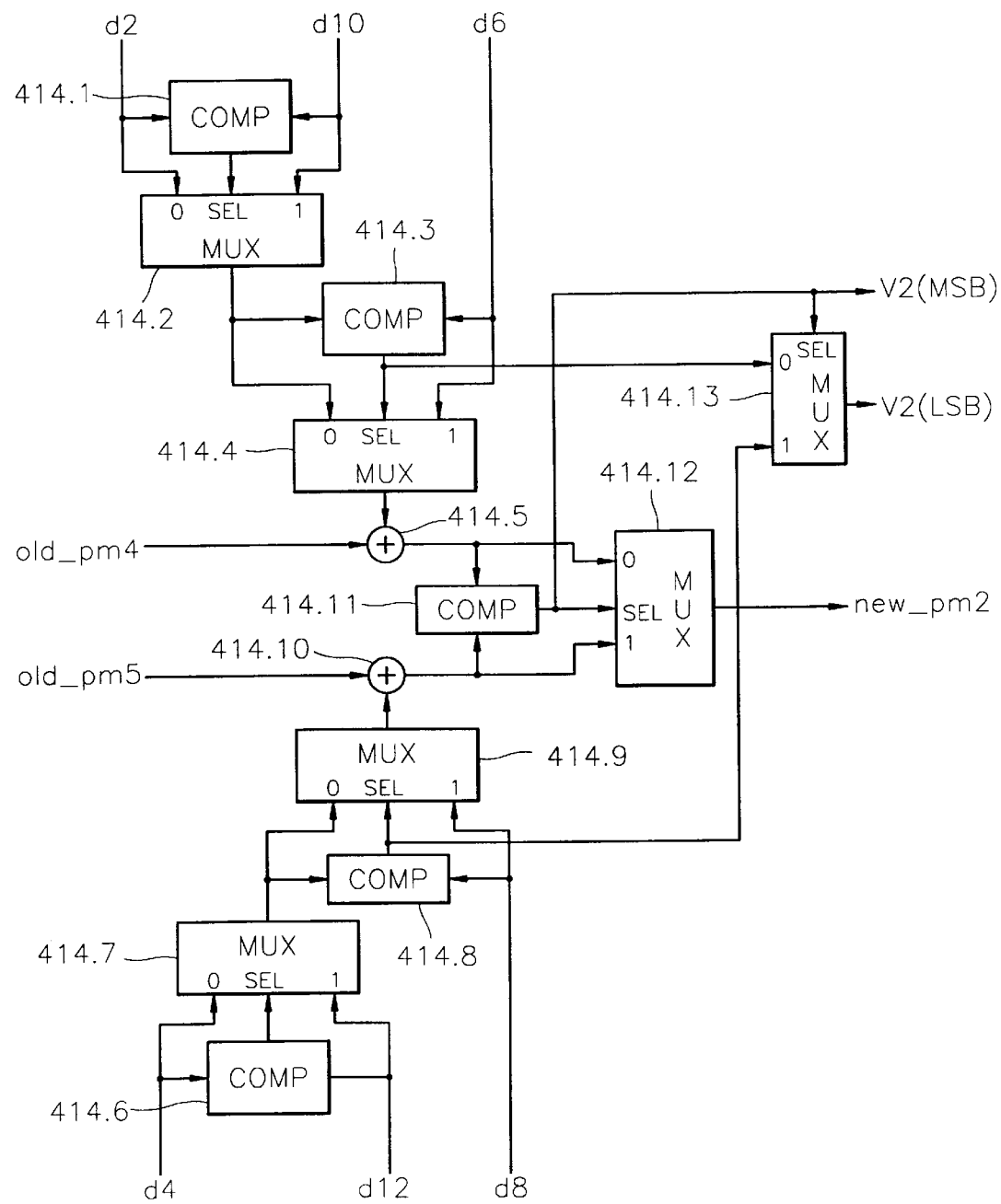
FIG. 15 is a detailed circuit diagram of a fifth survival path decider of FIG. 13.

FIG. 15 is a detailed circuit diagram of the fifth survivor decider 414 shown in FIG. 13, which is only for the 8-state case. Compared with the structure of the first survivor decider 402 of FIG. 14, the multiplexer 402.1 and the multiplexer 402.7 of FIG. 14 are omitted.

In FIG. 15, the greatest branch-metric among the branch-metrics d2, d10 and d8 with respect to the reference levels −10, 6 and −2 toward the current state 010 from the previous state 100 is selected via a comparator 414.1 and multiplexers 414.2, 414.3 and 414.4. The greatest branch-metric among the branch-metrics d4, d12 and d8 with respect to the reference levels −6, 10 and 2 toward the current state 010 from the previous state 101 is selected via a comparator 414.6 and multiplexers 414.7, 414.8 and 414.9.

An adder 414.5 adds the path metric old_pm4 accumulated in the previous state 100, output from the 12-symbol delay line 460 of FIG. 13, to the branch-metric selected by the multiplexer 414.4. An adder 414.10 adds the path metric old_pm5 accumulated in the previous state 101, output from the 12-symbol delay line 460, to the path metric selected by the multiplexer 414.9.

A comparator 414.11 compares the output of the adder 414.5 with the output of the adder 414.10 to output a comparison signal. The multiplexer 414.12 outputs the greatest value among the output of the adder 414.5, input to its first input port 0, and the output of the adder 414.10, input to its second input port 1, as a new path metric new_pm2.

The comparison signal output from the comparator 414.11 is output as the MSB of information V2 representing the survival path information of the current state "010". A multiplexer 414.13 selects either the output of the comparator 414.3 or of the comparator 414.8, according to the comparison signal provided by the comparator 414.11, to output the LSB of information V2 representing parallel path information of the selected survival path.

Figure 16:
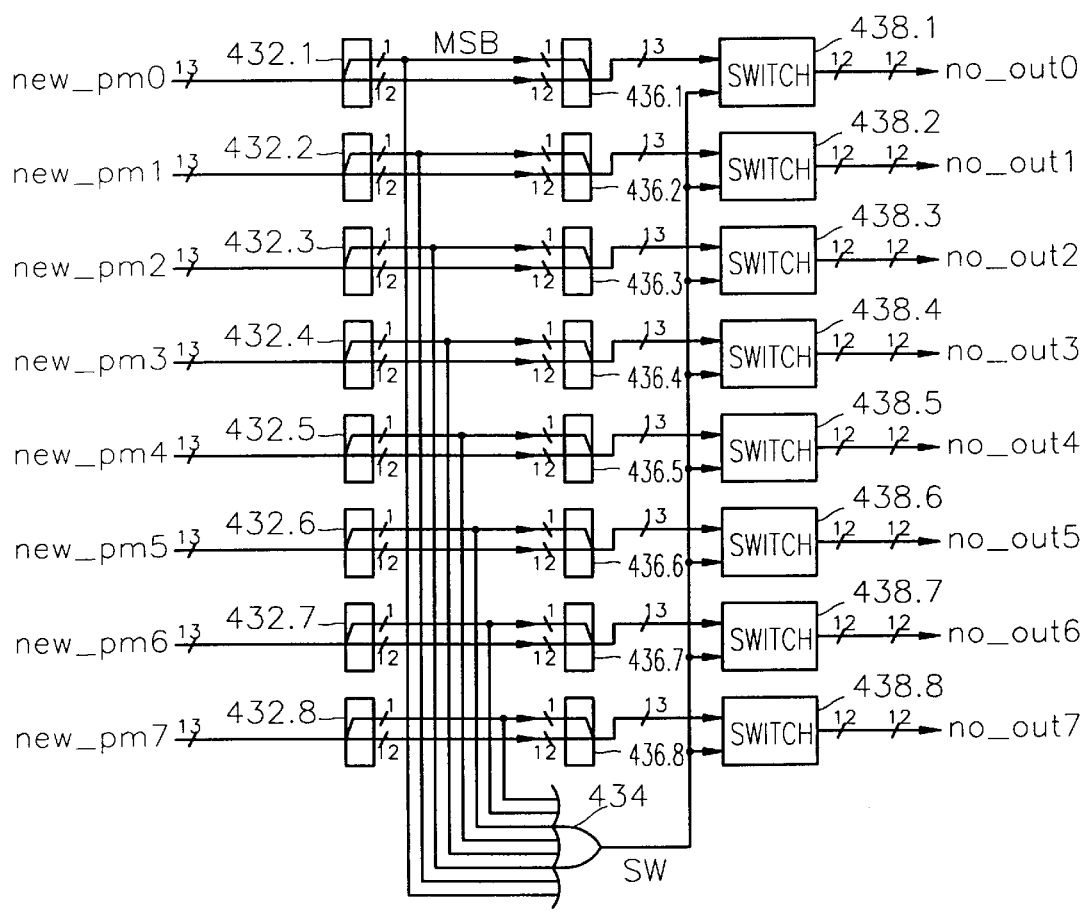
FIG. 16 is a detailed circuit diagram of a normalizer of FIG. 13.

FIG. 16 is a detailed circuit diagram of the normalizer 430 of FIG. 13. In FIG. 16, an OR gate 434 receives the MSBs of 13-bit new path metrics new_pm0 through new_pm7 output from the survivor deciders 402, 404 and 410 through 420 via bit dividers 432.1 through 432.8, and outputs a control signal to switches 438.1 through 438.8 if any of the MSBs of the new pass metrics new_pm0 through new_pm7 are logic "high". Each of the switches 438.1 through 438.8 outputs 12 bits of pass metric, from the LSB to the upper 11th bit of the output of the bit dividers 436.1 through 436.8, if the output of the OR gate 434 is logic "low". On the other hand, the switches 438.1 through 438.8 output the upper 12 bits exclusive of the LSB as normalized path metrics no_out0 through no_out7, if the output of the OR gate 434 is logic "high".

A trace-back memory 500 of the Viterbi decoder 230 of FIG. 9 traces back the survival path using the path metric of each state at an arbitrary stage, output from the ACS 400, and the decision vector dec_vec as the previous state information, thereby outputting the final two bits of the decoded data. Various methods of constituting the trace-back structure of the Viterbi decoder 230 have been suggested. However, the present invention adopts a 3-point even (PE) algorithm using a random access memory (RAM).

Figure 17:
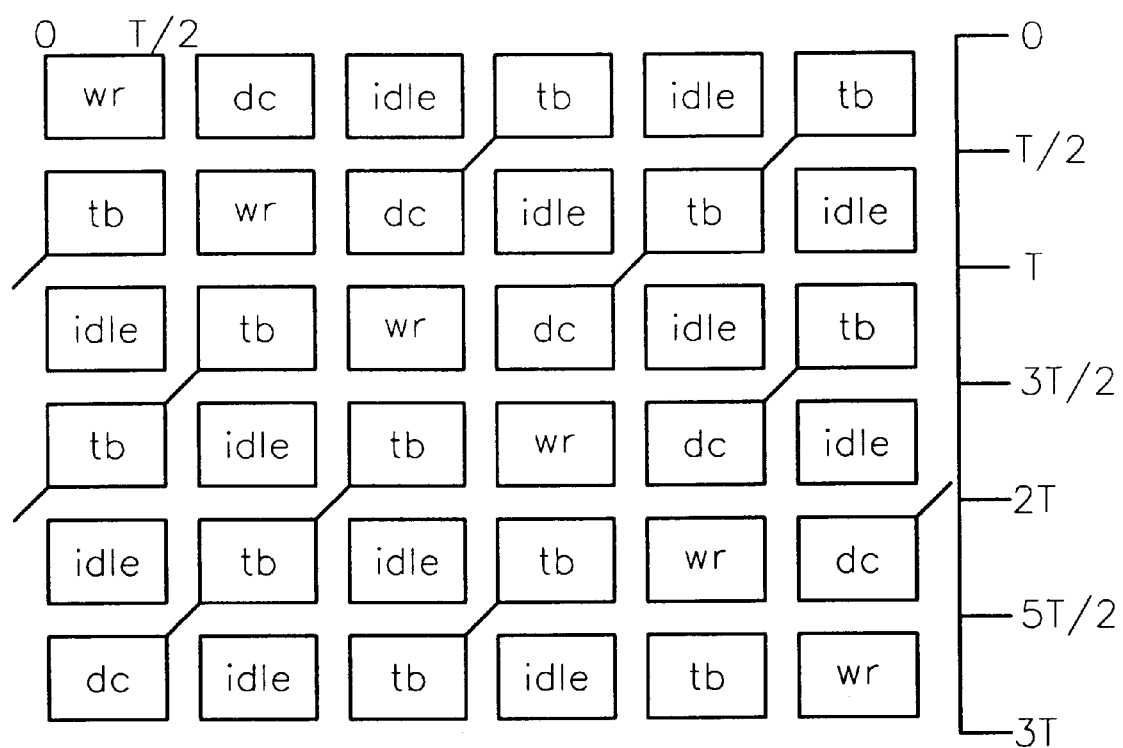
FIG. 17 is a diagram illustrating the operation of a trace-back memory using a 3-point even (PE) algorithm.

FIG. 17 is a memory control flow illustrating the concept of the 3-PE structure. Since the 3-PE algorithm uses a RAM, the total number of gates can be considerably reduced. In FIG. 17, the 3-PE algorithm basically requires 6 RAMs having a length corresponding to half of the decoding depth. That is, a memory having capacity corresponding to three times the decoding depth is required. The 3-PE algorithm has three basic operations: a writing step of writing data to the RAM, a trace-back step of deciding the starting state of the optimal path by reading the written data in opposite sequence to that used during the writing step, and a decoding step of decoding using the trace-back data. The steps are performed in sequence, and the decoded data is output in the opposite sequence to the original sequence, thus a last-in first-out (LIFO) step of correcting the sequence is necessary.

In the 3-PE algorithm, the segment sync or the field sync is processed as follows. That is, in the case of the segment sync, the data pattern output from the ACS 400 is checked, and the delayed output is fed back if the checked data pattern has a value (ffff)$_{HEX}$. In the case of the field sync signal, the data of the immediately following data segment is copied during the field sync segment period, thus there is no extra operation.

Figure 18:
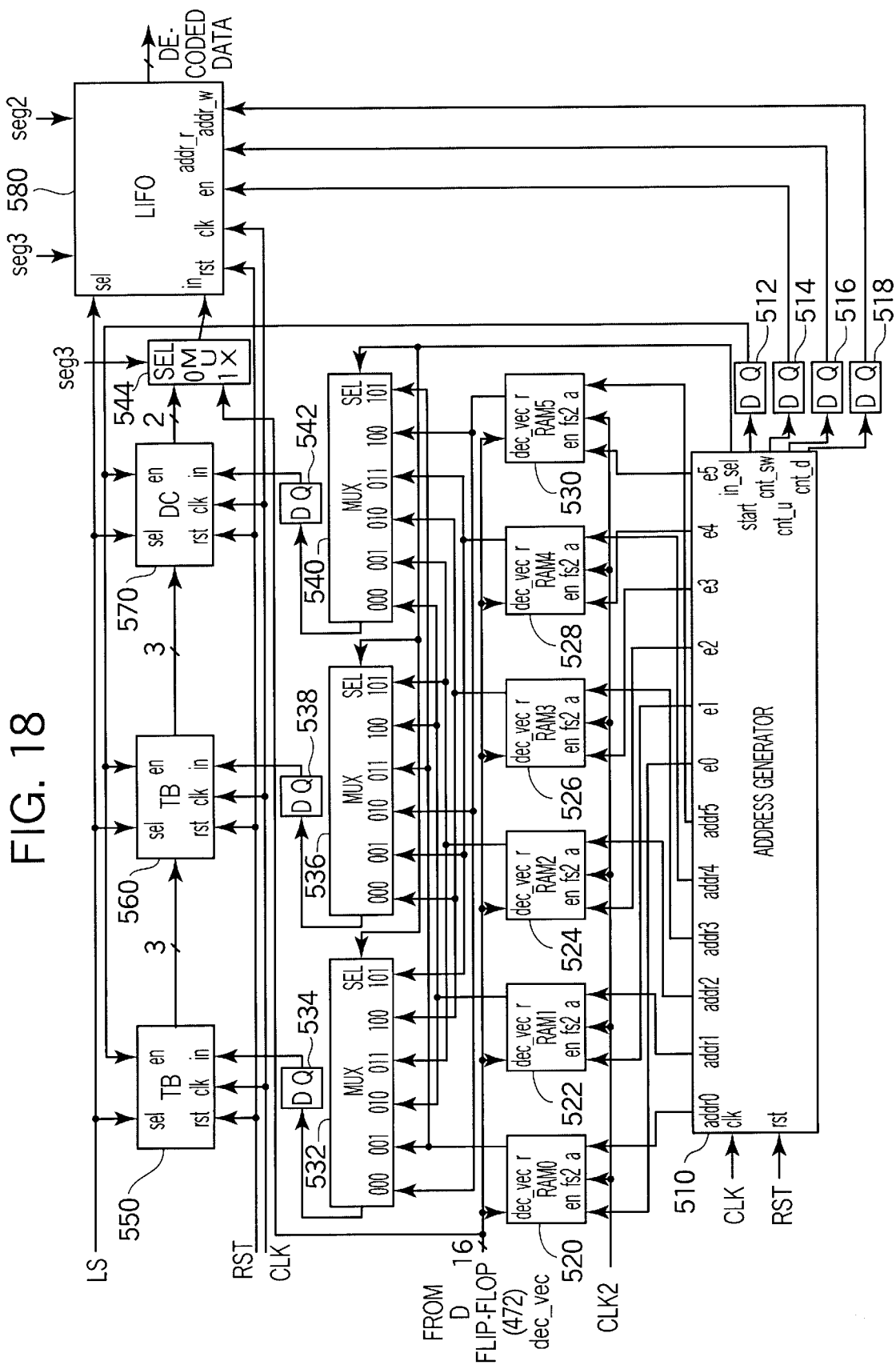
FIG. 18 is a detailed circuit diagram of a trace-back memory of FIG. 13.

FIG. 18 is a circuit diagram showing the structure of the trace-back memory of FIG. 9, which is achieved by the 3-PE algorithm. In FIG. 18, 6 RAMs 520, 522, 524, 526, 528 and 530 having a length of L/2 (L; decoding depth) are used to store the decision vector dec_vec generated from the D flip-flop 472 of the ACS 400 of FIG. 13.

In each RAM, the decoding is performed while four modes are performed sequentially according to a control signal: a writing mode, a trace-back mode, a decoding mode and an idle mode. In detail, the decision vector dec_vec received from the D flip-flop 472 of FIG. 13 is written to the RAM during the writing mode, and trace-back is performed in trace-back units (TBs) 550 and 560 by reading the data stored in the RAM during the trace-back mode. During the decoding mode, a decoding unit DC 570 reads the data written in the RAM and decodes the trace-back result of the TBs 550 and 560 starting from the state decided as the optimal path. The idle mode refers to the mode of timing without input and output of the data. Address values for accessing each RAM are determined by an up-counter and a down-counter. Here, two counters are used because the trace-back and decoding are opposite to each other in direction.

The RAMs 520 through 530 perform writing and reading according to writing/reading control signals e0 through e6 and address signals addr0 through addr5 generated by an address generator 510. A clock signal CLK2 having a frequency twice that of a system clock is applied to the RAMs 520 through 530.

The address generator 510 receives the system clock CLK and the system reset signal RST and outputs a selection signal in_sel to the selection ports SEL of the multiplexers 532, 536 and 540, and an enable signal "start" to the enable ports en of the first and second TBs 550 and 560 and the decoding unit 570 via a D flip-flop 512. Also, the address generator 510 outputs an enable signal cnt_sw to an enable port en of a last-in first-out (LIFO) memory 580 via a D flop-flop 514, and an up-count value cnt_u to a reading address port addr_r of the LIFO memory 580 via a D flip-flop 516 Also, the address generator 510 outputs a down-count value cnt_d to a writing address port addr_w of the LIFO memory 580 via a D flip-flop 518.

If a selection signal in_sel generated by the address generator 510 is "000", the multiplexer 532 selects the data read from the RAM 520 and applies the selected data to the first TB 550 via a D flip-flop 534. The multiplexer 536 selects the data read from the RAM 528 and applies the selected data to the second TB 560 via a D flip-flop 538. Also, the multiplexer 540 selects the data read from the RAM 522 and applies the selected data to the decoding unit 570 via a D flip-flop 542. The RAM 520 stores the decision vector dec_vec output from the D flop-flop 472 of FIG. 13, and the RAMs 524 and 528 are in the idle mode, doing no writing or reading operation.

When the selection signal in_sel generated by the address generator 510 is "001", the multiplexer 532 selects the data read from the RAM 520 and applies the selected data to the first TB 550 via the D flip-flop 534. The multiplexer 536 selects the data read from the RAM 528 and applies the selected data to the second TB 560 via the D flip-flop 538. Also, the multiplexer 540 selects the data read from the RAM 524 and applies the selected data to the decoding unit 570 via the D flip-flop 542. Here, the decision vector dec_vec is written to the RAM 522, and the RAMs 526 and 530 are in idle mode.

When the selection signal in_sel generated by the address generator 510 is "010", the multiplexer 532 selects the data read from the RAM 522 and applies the selected data to the first TB 550 via the D flip-flop 534. The multiplexer 536 selects the data read from the RAM 530 and applies the selected data to the second TB 560 via the D flip-flop 538. Also, the multiplexer 540 selects the data read from the RAM 526 and applies the selected data to the decoding unit 570 via the D flip-flop 542. Here, the decision vector dec_vec is written to the RAM 524, and the RAMs 520 and 528 are in idle mode.

When the selection signal in_sel generated by the address generator 510 is "011", the multiplexer 532 selects the data read from the RAM 524 and applies the selected data to the first TB 550 via the D flip-flop 534. The multiplexer 536 selects the data read from the RAM 520 and applies the selected data to the second TB 560 via the D flip-flop 538. Also, the multiplexer 540 selects the data read from the RAM 528 and applies the selected data to the decoding unit 570 via the D flip-flop 542. Here, the decision vector dec_vec is written to the RAM 526, and the RAMs 522 and 530 are in idle mode.

When the selection signal in_sel generated by the address generator 510 is "100", the multiplexer 532 selects the data read from the RAM 526 and applies the selected data to the first TB 550 via the D flip-flop 534. The multiplexer 536 selects the data read from the RAM 522 and applies the selected data to the second TB 560 via the D flip-flop 538. Also, the multiplexer 540 selects the data read from the RAM 530 and applies the selected data to the decoding unit 570 via the D flip-flop 542. Here, the decision vector dec_vec is written to the RAM 528, and the RAMs 520 and 524 are in idle mode.

When the selection signal in_sel generated by the address generator 510 is "101", the multiplexer 532 selects the data read from the RAM 528 and applies the selected data to the first TB 550 via the D flip-flop 534. The multiplexer 536 selects the data read from the RAM 524 and applies the selected data to the second TB 560 via the D flip-flop 538. Also, the multiplexer 540 selects the data read from the RAM 520 and applies the selected data to the decoding unit 570 via the D flip-flop 542. Here, the decision vector dec_vec is written to the RAM 530, and the RAMs 522 and 524 are in idle mode.

The reset signal RST, the system clock CLK and the 4-state/8-state selection signal LS are applied to the TBs 550 and 560 and the decoding unit 570.

The first TB 550 traces back the data written in the RAM selected by the multiplexer 532 via the D flip-flop 534 from the initial state "000", as far as the length corresponding to Y2 of the decoding depth according to the enable signal "start" generated by the address generator 510. The second TB 560 traces back the data written in the RAM selected by the multiplexer 536 via the D flip-flop 538 from the next state after the trace-back by the first TB 550, as far as the remaining Y2 decoding depth. The decoding unit 570 decodes the data written in the RAM selected by the multiplexer 540 via the D flip-flop 542 from the result of the trace-back by the second TB 560, corresponding to the state decided as the optimal path, according to the enable signal "start" generated by the address generator 510.

The multiplexer 544 selects (ffff)$_{HEX}$ output from the D flip-flop 472 during the segment sync period according to the third segment sync control signal seg3, and the output of the decoding unit 570 during the other period. The LIFO memory 580 corrects the sequence of the decoded data output from the decoding unit 570 via the multiplexer 544 into the original sequence. The 4-state/8-state selection signal LS, and the third segment sync control signal seg3 and the second field sync signal fld2 which are generated from the sync generator 200 of FIG. 9, are applied to the LIFO memory 580.

Figure 19:
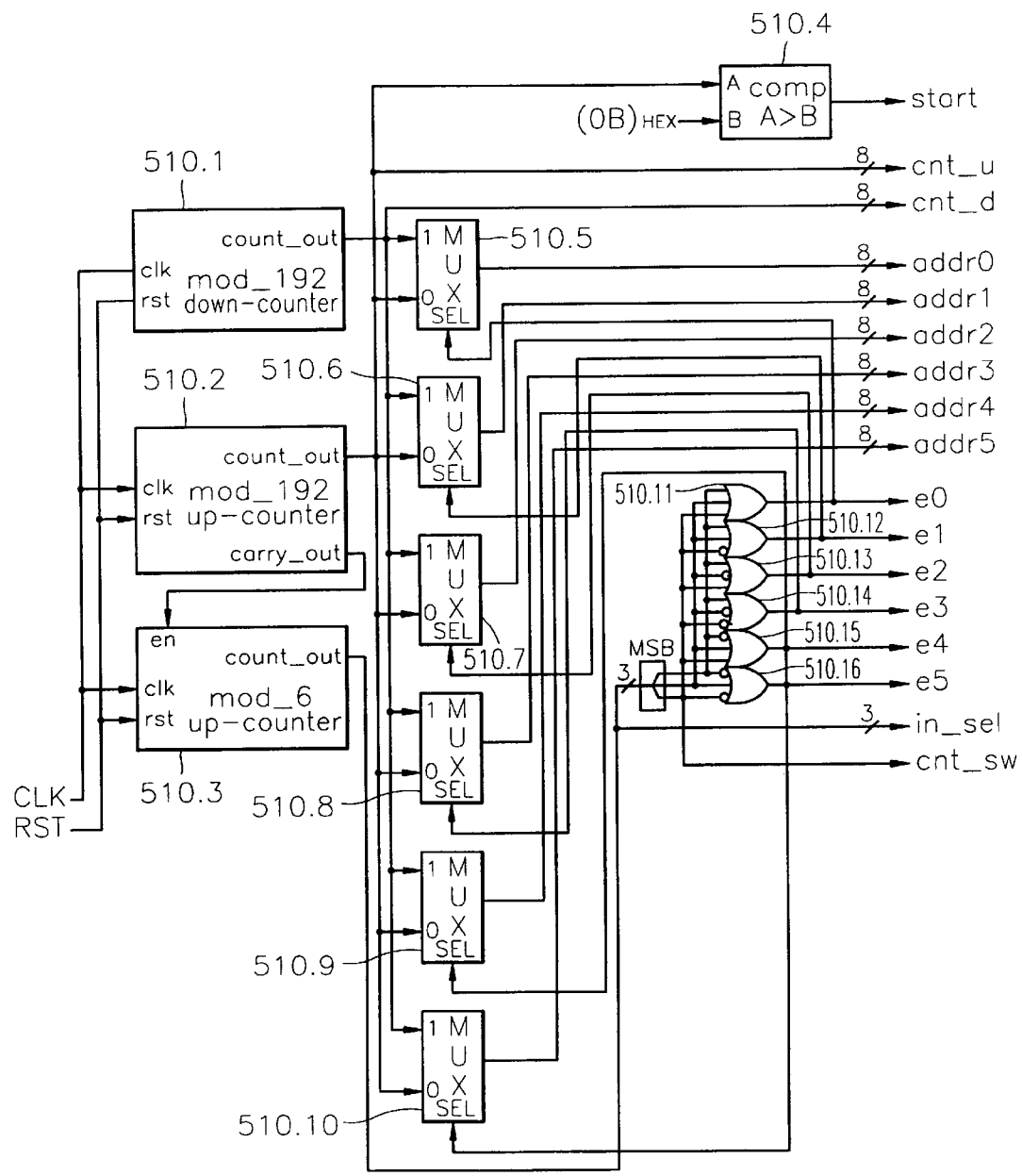
FIG. 19 is a detailed circuit diagram of an address generator of FIG. 18.

FIG. 19 is a detailed circuit diagram of the address generator 510 for generating the writing/reading addresses for respective RAMs 520~530 of FIG. 18 and other control signals. In FIG. 19, the address generator 510 basically has three counters 510.1 through 510.3. The output of a modulo (mod)__192 down-counter 510.1 is provided to the second input port 1 of each of the first through sixth multiplexers 510.5 through 510.10 to be used as the reading addresses of the RAMs 520 through 530 of FIG. 18, and is simultaneously output to the write address port addr__w of the LIFO memory 580 of FIG. 18 as a down count value cnt__d.

The output of a mod__192 up-counter 510.2 is provided to the first input port 0 of each of the first through sixth multiplexers 510.5 through 510.10 to be used as the writing addresses of the RAMs 520 through 530, and is simultaneously output to the read address port addr__r of the LIFO memory 580 as an up-count value cnt__u. Also, the output of the mod__192 up-counter 510.2 is provided to a first input port A of the comparator 510.4.

Since the input data is delayed by twelve symbols by each delay of the first and second TBs 550 and 560 and the decoding unit 570 in order to cope with 12-symbol interleaving, the comparator 510.4 compares an up address input to a first input port A generated by the up-counter 510.2 with an 8-bit hexadecimal number 0B (12 as a decimal number) input to a second input port B, and outputs a logic "high" signal as the enable signal "start" of the first and second TBs 550 and 560 and the decoding unit 570 of FIG. 18 if the address of the mod__192 up-counter 510.2 is greater than twelve.

Three bits generated by a mod__6 up-counter 510.3 for counting the number of carry of the mod__192 up-counter 510.2 are output as the selection signals in__sel of the multiplexers 532, 536 and 540 of FIG. 18. At the same time, the MSB of those three bits is applied to the first input port of each of the OR gates 510.11 through 510.15 and the first inverting input port of the OR gate 510.16, and the next upper bit is applied to the second input port of the OR gates 510.11, 510.12, 510.15 and 510.16, and the second inverting input port of each of the OR gates 510.13 and 510.14. Also, the LSB is applied to the third input ports of each of the OR gates 510.11, 510.13 and 510.15 and the third inverting input port of each of the OR gates 510.12, 510.14 and 510.16, and simultaneously output as the enable signal cnt__sw to the enable port en of the LIFO memory 580 of FIG. 18.

The OR gate 510.11 simultaneously outputs a logic low signal e0 to the selection port SEL of the multiplexer 510.5 and to the enable port en of the RAM 520 when the output signal of the mod__6 up-counter 510.3 is "000". When the signal e0 is logic low, the multiplexer 510.5 selects the output (up-address) of the mod__192 up-counter 510.2 to output the selected output as a write address (addr 0) to the address port "a" of the RAM 520. Here, the RAM 520 of FIG. 18 stores the input decision vector dec__vec. When the signal e0 is logic high, the multiplexer 510.5 selects the output (down-address) of the mod__192 down-counter 510.1 and outputs the selected output as a read address (addr 0) to the address port "a" of the RAM 520. Here, the RAM 520 reads out the written data.

The OR gate 510.12 simultaneously outputs a logic low signal e1 to the selection port SEL of the multiplexer 510.6 and to the enable port en of the RAM 522 when the output signal of the mod__6 up-counter 510.3 is "001". The multiplexer 510.6 selects the up-address when the signal e1 is logic low, and the down-address when the signal e1 is logic high, and outputs the results to the address port "a" of the RAM 522 as the write and read addresses (addr 1), respectively.

The OR gate 510.13 simultaneously outputs a logic low signal e2 to the selection port SEL of the multiplexer 510.7 and to the enable port en of the RAM 524 when the output signal of the mod__6 up-counter 510.3 is "010". The multiplexer 510.7 selects the up-address when the signal e2 is logic low, and the down-address when the signal e2 is logic high, and outputs the results to the address port "a" of the RAM 524 as the write and read addresses (addr 2), respectively.

The OR gate 510.14 simultaneously outputs a logic low signal e3 to the selection port SEL of the multiplexer 510.8 and to the enable port en of the RAM 526 when the output signal of the mod__6 up-counter 510.3 is "011". The multiplexer 510.8 selects the up-address when the signal e3 is logic low, and the down-address when the signal e3 is logic high, and outputs the results to the address port "a" of the RAM 526 as the write and read addresses (addr 3), respectively.

The OR gate 510.15 simultaneously outputs a logic low signal e4 to the selection port SEL of the multiplexer 510.9 and to the enable port en of the RAM 528 when the output signal of the mod__6 up-counter 510.3 is "100". The multiplexer 510.9 selects the up-address when the signal e4 is logic low, and the down-address when the signal e4 is logic high, and outputs the results to the address port "a" of the RAM 528 as the write and read addresses (addr 4), respectively.

The OR gate 510.16 simultaneously outputs a logic low signal e5 to the selection port SEL of the multiplexer 510.10 and to the enable port en of the RAM 530 when the output signal of the mod__6 up-counter 510.3 is "101". The multiplexer 510.10 selects the up-address when the signal e5 is logic low, and the down-address when the signal e5 is logic high, and outputs the results to the address port "a" of the RAM 530 as the write and read addresses (addr 5), respectively.

Figure 20:
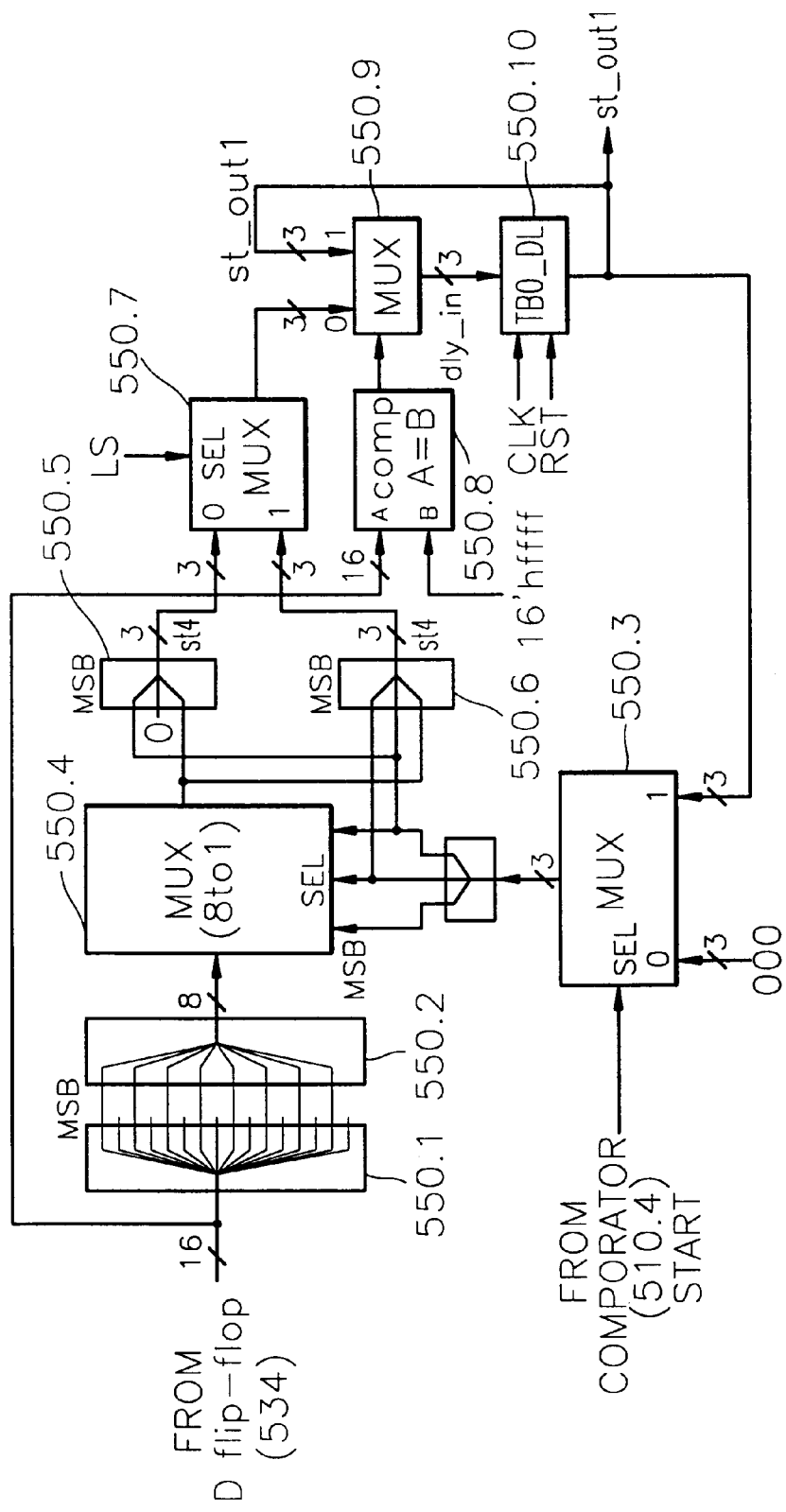
FIG. 20 is a detailed circuit diagram of a first trace-back unit of FIG. 18.
Figure 21:
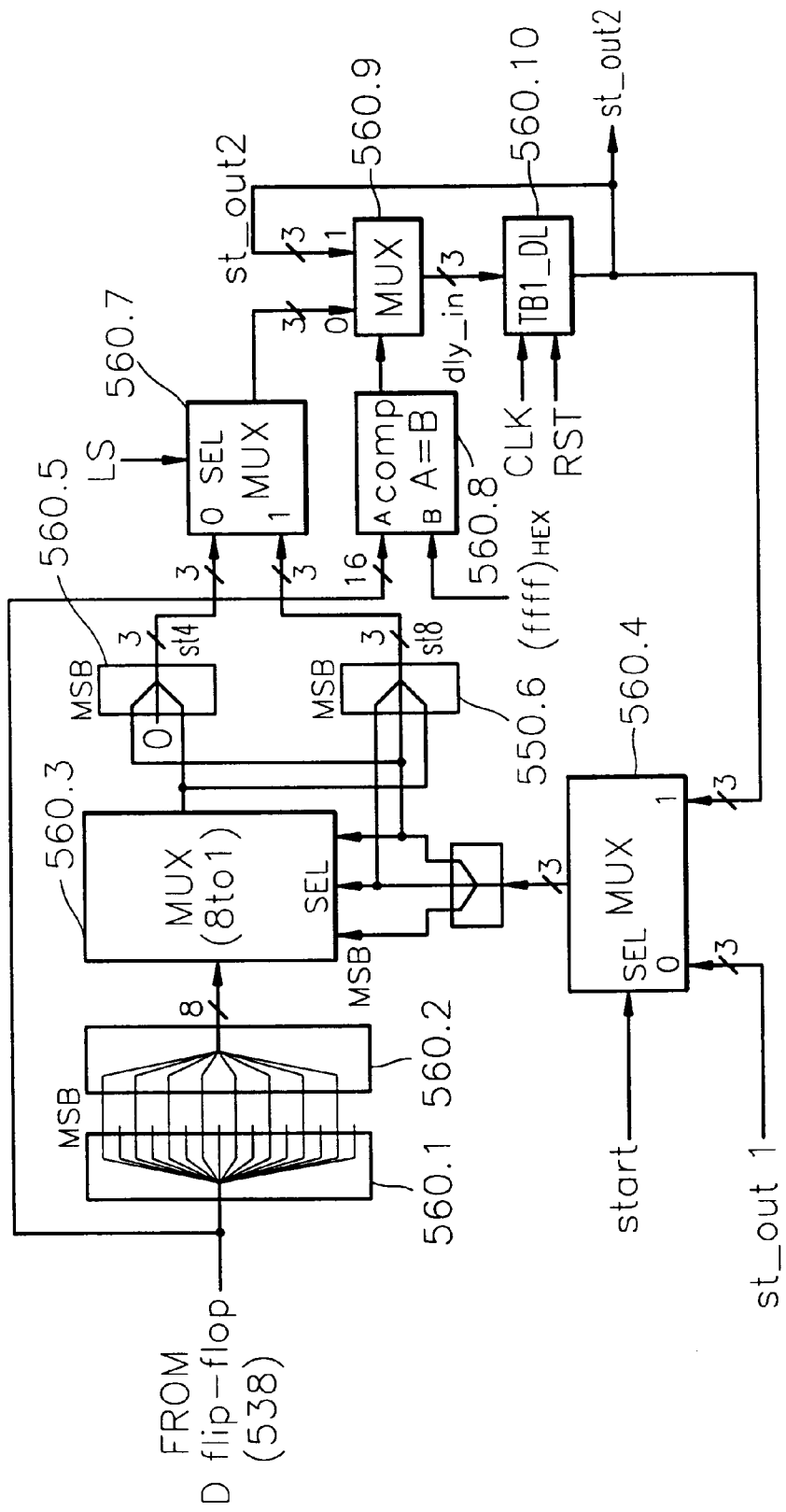
FIG. 21 is a detailed circuit diagram of a second trace-back unit of FIG. 18.

FIG. 20 is a detailed circuit diagram of the first TB 550 of FIG. 18, for performing the first trace-back process. FIG. 21 is a detailed circuit diagram of the second TB of FIG. 18, for performing the second trace-back process. Here, the trace-back process is performed in two parts because the length of one RAM is half of the decoding depth. That is, if the trace-back process was performed only once, the actual decoding depth would be reduced by ½.

In FIG. 20, a bit divider 550.1 divides the 16-bit decision vector dec__vec, which is the previous state information at each state, output from the D flip-flop 534 of FIG. 18, by two bits. The MSB selector 550.2 selects the MSB of each of the eight 2-bit outputs of bit divider 550.1, and outputs the survival path information in the 8-state case to the multiplexer 550.4.

A multiplexer 550.3 selects the state value according to the enable signal "start" output from the comparator 510.4 of the address generator 510 shown in FIG. 19. That is, if the enable signal is logic "0", three bits "000", which is a predetermined initializing state value, are selected. Otherwise, the fedback state value output from a 12-symbol delay (TB0_DL) 550.10 is selected.

A multiplexer 550.4 selects one of the MSBs at each state, output from the MSB selector 550.2, according to the state value selected by the multiplexer 550.3. A bit collator 550.5 constitutes three bits in order to generate the previous state value for the 4-state case by selecting the output of the multiplexer 550.3 as the MSB and the output of the multiplexer 550.4 as the LSB and inserting "0" as the middle bit. This is for matching $00_b$, $01_b$, $10_b$ and $11_b$ of the 4-state case with $000_b$, $001_b$, $100_b$ and $101_b$, respectively, of the 8-state case, in order to share transitions between the 4-state case and the 8-state case as can be known from the trellis diagrams of FIGS. 12A and 12B.

A bit collator 550.6 generates the previous state value for the 8-state case by selecting the second upper bit and the LSB of the 3-bit state value selected by the multiplexer 550.3 as the MSB and the second upper bit of the previous state value, respectively, and by using the 1 bit selected by the multiplexer 550.4 as the LSB of the previous state value.

A multiplexer 550.7 selects the previous state value according to the 4-state/8-state selection signal LS. That is, if the LS is logic "0", which represents the 4-state case, the 3-bit previous state value constituted by the bit collator 550.5, input to the first input port 0, is selected. Otherwise, if the LS is logic "1", which represents the 8-state case, the 3-bit previous state value constituted by the bit collator 530.6, input to the second input port 1, is selected.

A comparator 550.8 compares the decision vector dec_vec output from the D flip-flop 534 of FIG. 18 with a predetermined value (ffff)$_{HEX}$. If the two compared values are equal to each other, a logic "high" signal which represents the segment sync period is output. According to a comparison signal output from the comparator 550.8, a multiplexer 550.9 selects the output of the multiplexer 550.7 at times other than the segment sync period, and delays the selected output by twelve symbols by the 12-symbol delay TB0_DL 550.10. Then, the delayed result is output to the second TB 560 and simultaneously fed back the second input port 1 of the multiplexer 550.3 and the second input port 1 of the multiplexer 550.9. On the other hand, during the segment sync period, the output of the 12-symbol delay 550.10, fed back, is selected. Here, delaying the fed-back state value by twelve symbols is to cope with the 12-symbol interleaving by an encoder.

Figure 22:
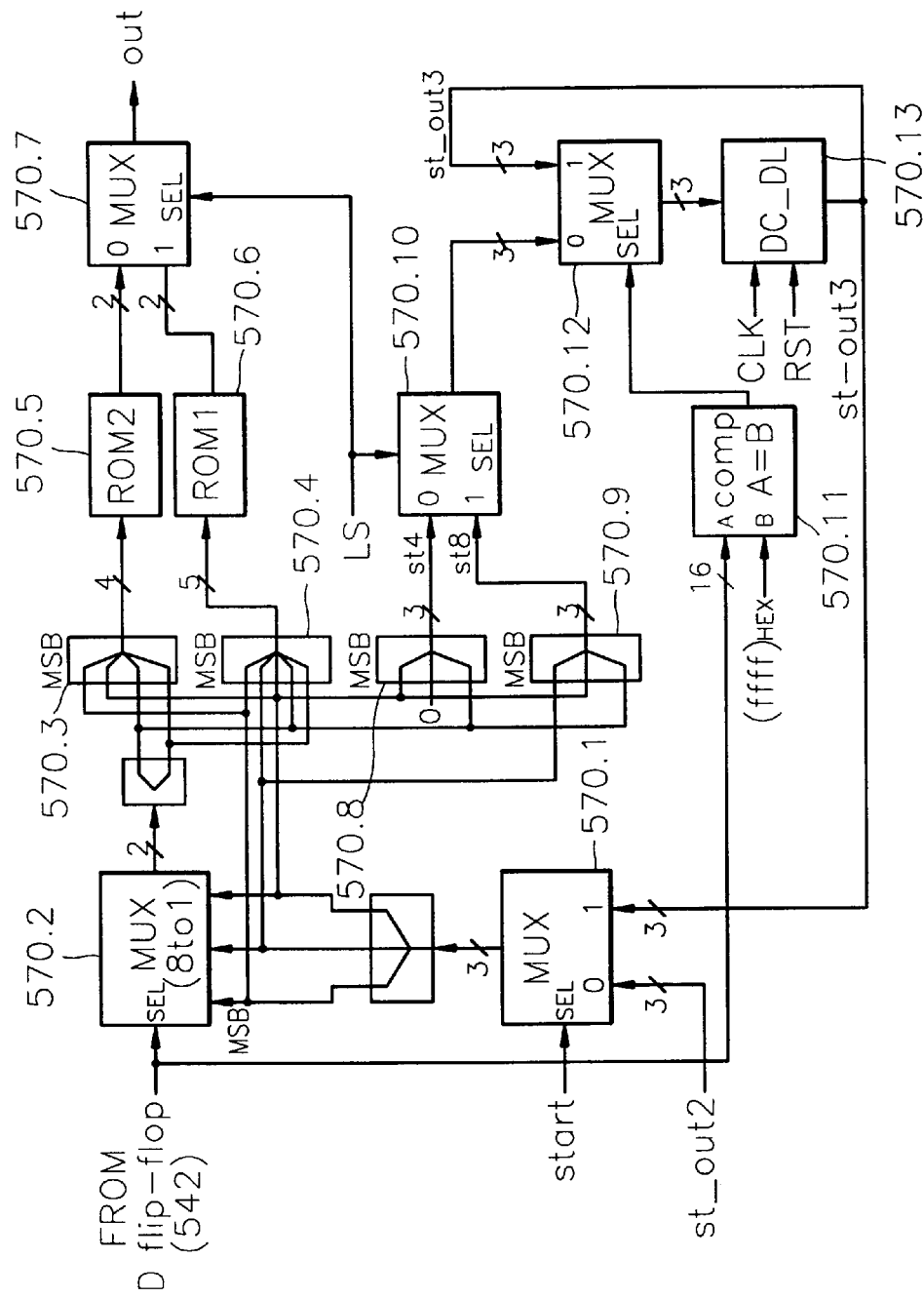
FIG. 22 is a detailed circuit diagram of a decoding unit of FIG. 18.

The structure of the second TB of FIG. 21 is similar to that of the first TB of FIG. 20 except that the initial value stored in the 12-symbol delay 550.10 is different. That is, in the case of the first TB 550 of FIG. 20, the initial value of the 12-symbol delay 550.10, in which the 3-bit current state value is to be stored, is "000" selected by the multiplexer 550.3 during the 12-symbol period. On the other hand, in the case of the second TB 560 of FIG. 21, the initial value stored in a 12-symbol delay (TB1_DL) 560.10 is the output st_out1 of the 12-symbol delay 550.10 of the first TB 560, which is selected by the multiplexer 560.4. Thus, when the trace-back reaches the first symbol, starting from the last symbol read from the RAM via the D flip-flop 538 of FIG. 18, the second TB 560 transfers the previous state value on the first 12 symbols to the decoding unit 570 of FIG. 22 for the decoding. FIG. 22 is a detailed circuit diagram of the decoding unit 570 of FIG. 18. In FIG. 22, a multiplexer 570.1 provides the current state value according to the enable signal "start" output from the address generator 510 of FIG. 18. That is, if the enable signal "start" is logic "low", the 3-bit state value output from the 12-symbol delay 560.10 of the second TB 560 of FIG. 21 is selected. If the enable signal "start" is logic "high", a delayed 3-bit state value output from a 12-symbol delay (DC_DL) is selected as the current state value.

A multiplexer 570.2 selects the 2-bit information of the previous state among the previous state information on the 8-state case, divided by two bits and output via the D flip-flop 542 of FIG. 18, according to the current state value selected by the multiplexer 570.1.

A bit collator 570.3 constitutes a 4-bit pass information by selecting the MSB and LSB of the 3-bit state value selected by the multiplexer 570.1 as the MSB and the upper bit, and by selecting 2 bits selected by the multiplexer 570.2 as lower bits. That is, in the 4-state case, only two bits, the MSB and the LSB, are selected among the 3-bit current state value, and the selected two bits are combined with the 2-bit previous state value, resulting in 4-bit path information. A bit collator 570.4 selects the 3 bits selected by the multiplexer 570.1 as the upper 3 bits, and the 2 bits selected by the multiplexer 570.2 as the LSB and the lower bit, to contribute 5-bit path information. That is, in the 8-state case, the 3-bit current state value is selected as upper bits and the 2-bit previous state information as lower bits, to constitute 5-bit path information capable of expressing all possible paths of the 8-state trellis diagram.

If driving a second ROM 570.5 for the 4-state case using the 4 bits constituted by the bit collator 570.3 as addresses, and a first ROM 570.6 for the 8-state case using the 5 bits constituted by the bit collator 570.4 as addresses, then a 2-bit final decoded data can be obtained. Here, ROM tables for the first and second ROMs 570.6 and 570.5 are shown in FIG. 23. For example, in the 8-state case, when the current state value selected by the multiplexer 570.1 is "101" and the previous state information selected by the multiplexer 570.2 is "10", the bit collator 570.4 outputs "10110(=$16_{HEX}$)", and the first ROM 570.6 outputs the 2-bit decoded data "00". The multiplexer 570.7 outputs the decoded data according to the 4-state/8-state selection signal LS. That is, the decoded data stored in the second ROM 570.5 is output in the 4-state case, and the decoded data stored in the first ROM 570.6 is output in the 8-state.

On the other hand, in order to cope with the 12-symbol interleaving and the segment sync signal, a bit collator 570.8 constitutes the previous state value for the 4-state case by selecting the LSB of the 3 bits selected by the multiplexer 570.1 as the MSB, inserting "0" as the middle bit, and selecting the MSB of the 2 bits selected by the multiplexer 570.2 as the LSB. A bit collator 570.9 constitutes the previous state value for the 8-state case by selecting the two lower bits of the 3 bits selected by the multiplexer 570.1 as the upper two bits, and the MSB of the 2 bits selected by the multiplexer 570.2 as the LSB.

A multiplexer 570.10 makes its selection according to the 4-state/8-state selection signal LS. That is, the output of the bit collator 570.8 is output in the 4-state case, and the output of the bit collator 570.9 is output in the 8-state case. A comparator 570.11 compares the previous information for the 8-state case, output via the D flop-flop 542, with (ffff)$_{HEX}$, and outputs a logic "high" comparison signal representing the segment sync period if the two compared values are equal to each other. A multiplexer 570.12 makes its selection according to the comparison signal of the comparator 570.11. That is, the multiplexer 570.12 selects the output of the multiplexer 570.10 at times other than the segment sync period, and the selected output is then delayed by 12 symbols by a 12-symbol delay 570.13 in order to cope with the 12-symbol interleaving. Then, the delayed output is fed back to the second input port 1 of the multiplexer 570.1 and the second input port 1 of the multiplexer 570.12. On the other hand, during the segment sync period, the multiplexer 570.12 selects the output of the 12-symbol delay 570.13.

The data decoded by the decoding unit 570 is output in the opposite sequence to the encoding sequence. Thus, a LIFO process is necessary to output the decoded data forward. The detailed circuit diagram of the LIFO memory 580 for the LIFO process is shown in FIG. 24.

Figure 24:
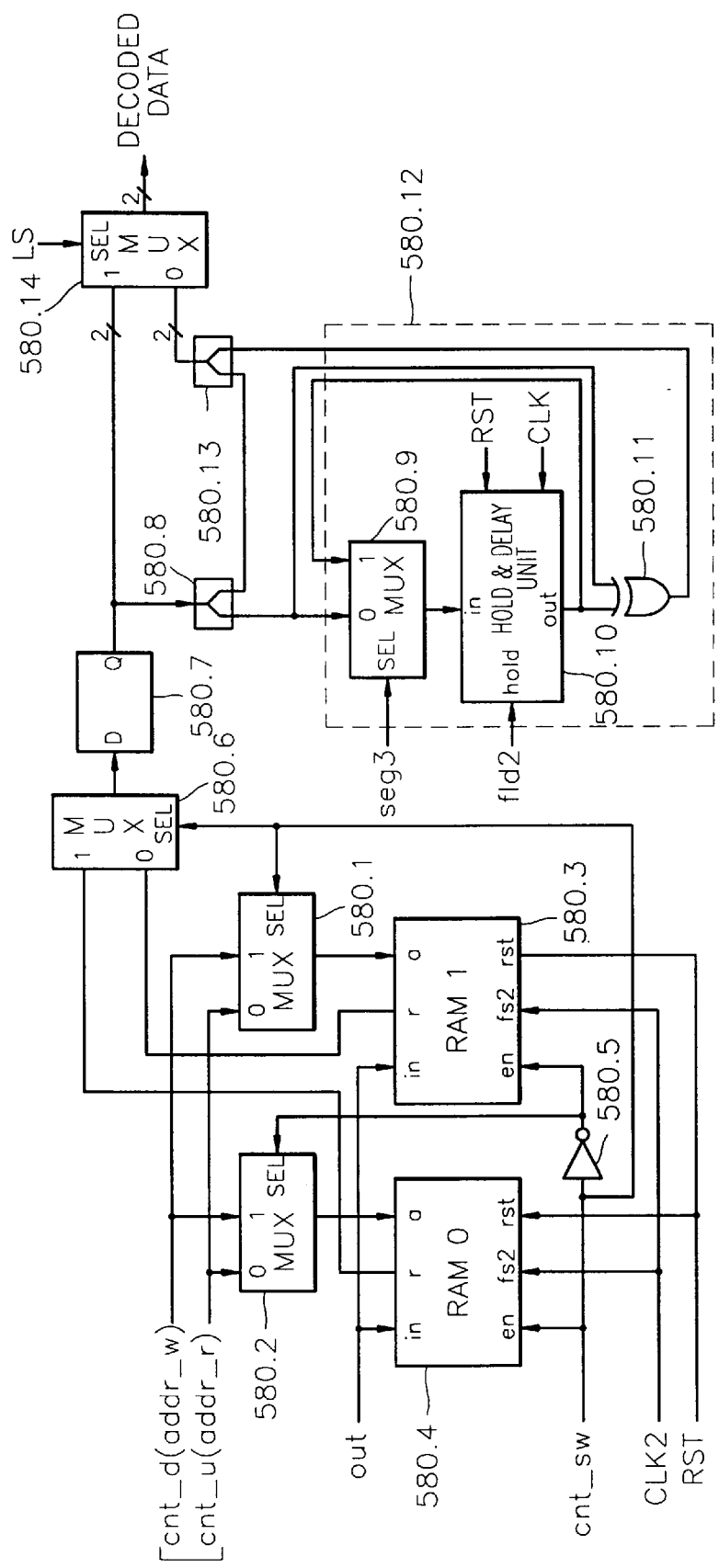
FIG. 24 is a detailed circuit diagram of a last-in first-out (LIFO) memory of FIG. 18.

In FIG. 24, the LIFO memory 580 includes two RAMs 580.3 and 580.4. Here, data is written to one RAM while data is read from the other RAM. The down-count value cnt_d of the mod_192 down-counter 510.1 of the address generator 510 shown in FIG. 18 is used as the write address addr_w of the RAMs 580.3 and 580.4, and the up-counter value cnt_u of the mod_192 up-counter 510.2 is used as the read address addr_r, such that the decoded data is output forward by the LIFO memory 580 in the opposite sequence to which it is written to and read from the ROMs 520 through 530.

That is, the write address addr_w is applied to the second input ports 1 of the multiplexers 580.1 and 580.2, and the read address addr_r is applied to the first input ports 0 of the multiplexers 580.1 and 580.2. The enable signal cnt_sw generated by the address generator 510 of FIG. 18 is applied to the selection port SEL of the multiplexer 580.1, and the output of an inverter 580.5 for inverting the enable signal cnt_sw is applied to the selection port SEL of the multiplexer 580.2. Thus, when the multiplexer 580.1 selects the write address addr_w, the multiplexer 580.2 selects the read address addr_r. On the other hand, when the multiplexer 580.1 selects the read address addr_r, the multiplexer 580.2 selects the write address addr_w. The selected addresses are applied to the address ports "a" of the RAMs 580.3 and 580.4.

Also, input ports "in" of the RAMs 580.3 and 580.4 receive the decoded data "out" output from the multiplexer 570.7 of the decoding unit 570 shown in FIG. 22, enable ports "en" thereof receive the enable signal cnt_sw generated by the address generator 510, and clock ports fs2 thereof receive the clock signal CLK2 having a frequency twice the system clock, and reset ports rst thereof receive the system reset signal RST. Thus, the RAMs 580.3 and 580.4 write the decoded data according to the down-count value cnt_d, and read the decoded data according to the up-count value cnt_u, and apply the read data to the first and second input ports 0 and 1 of a multiplexer 580.6.

The multiplexer 580.6 selects the decoded data read from the RAM 580.3 or the decoded data read from the RAM 580.4 according to the enable signal cnt_sw input to the selection port SEL, and latches the selected data to a D flip-flop 580.7.

Here, as can be known from the TCM encoder shown in FIG. 1, the MSB of the input two bits is differentially coded. Thus, in the 4-state case, the MSB of the output of the D flip-flop 580.7 must be passed through a differential decoder 580.12. In the 8-state case, as can be known from the TCM encoder of FIG. 6A, the effect of the differential coding is offset by comb-filtering, thus an extra differential decoder is unnecessary.

An MSB selector 580.8 applies only the MSB of the two bits output from the D flip-flop 580.7 to a first input port 0 of a multiplexer 580.9, and the remaining 1 bit to a bit collator 580.13. The multiplexer 580.9 makes its selection according to the third segment sync control signal shown by waveform D in FIG. 10. That is, the output of the MSB selector 580.8 is selected at times other than the segment sync period, and the fed-back output of a hold & delay unit 580.10 is selected during the segment sync period. The hold & delay unit 580.10 delays the signal selected by the multiplexer 580.9 by twelve symbols according to the system clock CLK, and holds the output of the multiplexer 580.9 during the field sync period according to the second field sync control signal fld2 of FIG. 12G. The hold & delay unit 580.10 is reset by the system reset signal RST.

An exclusive OR (XOR) gate 580.11 performs an XOR operation on the output of the hold & delay unit 580.10 and the output of the MSB selector 580.8, and a bit collator 580.13 collates the LSB, which is not selected by the MSB selector 580.8, and the differentially decoded MSB output from the XOR gate 580.11, and outputs the result to a multiplexer 580.14.

The multiplexer 580.14 makes its selection according to the 4-state/8-state selection signal LS, and outputs the selected output as the final decoded data. That is, the output of the D flip-flop 580.7 which is input to the first input port 1 without going through the differential decoding is selected in the 8-state case, and the output of the bit collator 580.13 which is input to the second input port 0 via the differential decoder 580.12 is selected in the 4-state case.

In addition, the inherent delay (two symbols) in the second segment sync control signal seg2 shown in waveform C in FIG. 10 is caused by the multiplexer 216 of FIG. 9 and the multiplexer 302 of FIG. 11. Also, the inherent delay (325 symbols) in the third segment sync control signal seg3 of waveform D in FIG. 10 is obtained by subtracting the 832-symbol delay, caused by the 832-symbol delay 222 shown in FIG. 9, from the 1152(=192ae6)-symbol delay, caused by the array of the six RAMs 520 through 530, and adding a total of 5 symbols delay, caused by the multiplexer 216 of FIG. 9, the multiplexer 302 of FIG. 11, the D flip-flop 472 of FIG. 13, the D flip-flop of FIG. 18 and the D flip-flop 580.7 of FIG. 24. Here, the reason why the 832 symbols are subtracted is that a segment sync signal is generated every segment. Also, the inherent delay (1989 symbols) in the second field sync control signal fld2 of waveform G in FIG. 10 is obtained by summing the 1152-symbol delay caused by the array of the six RAMs 520 through 530 shown in FIG. 18, the 832-symbol delay caused by the 832-symbol delay 222 shown in FIG. 9, and the total of five symbols of delay caused by the multiplexer 216 of FIG. 9, the multiplexer 302 of FIG. 11, the D flip-flop 472 of FIG. 13, the D flip-flop 542 of FIG. 18 and the D flip-flop 580.7 of FIG. 24. Also, the inherent delay in the field reset signal fld_rst of waveform H in FIG. 10 is obtained by adding the 2-symbol delay caused by the multiplexer 216 of FIG. 9 and the multiplexer 302 of FIG. 11, to the 832-symbol delay caused by the 832-symbol delay 222 of FIG. 9.

As described above, the TCM decoder of the present invention decodes based on the coding sequence in consideration of uncoded segment sync and field sync signals, thereby achieving stable decoding.

Also, since the TCM decoder of the present invention can decode both in 4-state case, and 8-state case using a comb filter for eliminating the effect of an NTSC signal in a receiver. Finally, the decoder can be built easily.

Although the invention has been described in terms of preferred embodiments, it will be appreciated that many changes and modifications may be made to the described embodiments without departing from the spirit and scope of the invention.

What is claimed is:

1. A trellis-coded modulation (TCM) decoder of a receiver having a National Television System Committee (NTSC) rejection filter for rejecting interference by an NTSC signal, wherein an input high-definition television (HDTV) signal constitutes each of its frames with two fields, each field includes a field synchronization segment and data segments, each segment includes a segment synchronization signal, and each field synchronization segment includes a field synchronization signal, the TCM decoder comprising:

a segment synchronization suspension unit for directly connecting the data before and after a first predetermined number of symbols based on the segment synchronization signal when the input HDTV signal has passed through the NTSC rejection filter, and for passing the input HDTV signal unchanged when the input HDTV signal has not passed through the NTSC rejection filter;

a field delay for directly connecting the data of the data segment just before the field synchronization segment to the data of the data segment just after the field synchronization segment, which are output from the segment synchronization suspension unit; and a Viterbi decoder for decoding the output of the field delay in both an 8-state mode where the input HDTV signal has passed through the NTSC rejection filter and a 4-state mode where the input HDTV signal has not passed through the NTSC rejection filter.

2. The TCM decoder of claim 1, wherein the Viterbi decoder comprises:

a branch-metric generator for generating branch-metrics by calculating an error between the output of the field delay and a plurality of reference signal levels appropriate to the 4-state mode or the 8-state mode;

an addition-comparison selector for selecting an optimal path at a current node of each state by using each branch-metric converging on each state and a path metric accumulated up to the previous symbol, according to the 4-state mode or the 8-state mode, and outputting the selected path as an optimal path information; and a trace-back memory for tracing back the optimal path information according to the 4-state mode or the 8-state mode to output decoded data.

3. The TCM decoder of claim 2, further comprising a sync generator for applying a first segment sync control signal to the segment synchronization suspension unit, a first field sync control signal to the field delay, a second segment sync control signal and a field reset signal to the addition-comparison selector, and a third segment sync control signal and a second field sync control signal to the trace-back memory, in response to input segment sync timing signal and field sync timing signal.

4. The TCM decoder of claim 3, wherein the field delay comprises:

a segment delay for delaying the output of the segment sync suspension unit in units of a segment; and a selector for selecting the output of the segment synchronization suspension unit in a field synchronization period, and selecting the output of the segment delay in any other period, according to the first field sync control signal.

5. The TCM decoder of claim 2, wherein the branch-metric generator comprises:

a memory for storing branch-metrics representing the error between the output of the field delay and a plurality of reference levels for the 8-state mode;

a subtractor for subtracting "1" from the output of the field delay; and a selector for selecting the output of the field delay in the 8-state mode, and the output of the subtractor in the 4-state mode, and for outputting the selected result as an address signal for the memory.

6. The TCM decoder of claim 3, wherein the addition-comparison selector comprises:

a plurality of first survivor deciders capable of operating in both 4-state and 8-state modes, for deciding a survivor having the least path-metric among all paths input in the current state by receiving the previous path-metric at each state shared by trellis diagrams for the 4-state mode and the 8-state mode and the branch-metrics generated by the branch-metric generator according to the trellis diagrams, and outputting the previous state information of the survivor at each state and new path-metrics at each state;

a plurality of second survivor deciders operating in the 8-state mode, for deciding a survivor having the least path-metric among all paths input in the current state by receiving the previous path-metric at each state which is not shared by the trellis diagram for the 4-state mode and the 8-state mode and the branch-metrics generated by the branch-metric generator according to the trellis diagram for the 8-state mode, and outputting the previous state information of the survivor at each state and new path-metrics at each state; and a path-metric selector for selecting the new path-metrics output from the first and second survivor deciders at times other than the segment synchronization period, and selecting the previous path-metrics in the segment synchronization period, according the second segment sync control signal;

a delay line for generating the previous path-metrics by delaying the path-metrics selected by the path-metric selector by the first predetermined number of symbols; and a pattern inserter for outputting the previous state information of each state, output from the first and second survivor decider, at times other than the segment sync period, and outputting a predetermined data pattern during the segment sync period, according to the second segment sync signal.

7. The TCM decoder of claim 6, further comprising a normalizer for normalizing each new path metric to prevent overflow by checking the most significant bits (MSBs) of the new path-metrics output from the first and second survivor deciders, and outputting normalized path-metrics to the path-metric selector.

8. The TCM decoder of claim 6, wherein each of the first survivor decider comprises:

a first selector for selecting a first branch-metric in the 4-state mode and a second branch-metric in the 8-state mode, according to the 4-state/8-state mode;

a first comparator for comparing the first branch-metric with a branch-metric selected by the first selector to output a first comparison signal;

a second selector for selecting a branch-metric selected by the first selector if the branch-metric selected by the first selector is greater than the first branch-metric, and otherwise selecting the first branch-metric, according to the first comparison signal;

a second comparator for comparing the branch-metric selected by the second selector with a third branch-metric to output a second comparison signal;

a third selector for selecting the third branch-metric if the third branch-metric is greater than the branch-metric selected by the second selector, and otherwise selecting the branch-metric selected by the second selector, according to the second comparison signal;

a first adder for adding a branch-metric selected by the third selector to a first previous path-metric;

a fourth selector for selecting a fourth branch-metric in the 4-state mode and a fifth branch-metric in the 8-state mode, according to the 4-state/8-state mode;

a third comparator for comparing the fourth branch-metric with a branch-metric selected by the fourth selector to output a third comparison signal;

a fifth selector for selecting the branch-metric selected by the fourth selector if the branch-metric selected by the fourth selector is greater than the fourth branch-metric, and otherwise selecting the fourth branch-metric, according to the third comparison signal;

a fourth comparator for comparing the branch-metric selected by the fifth selector with a sixth branch-metric to output a fourth comparison signal;

a sixth selector for selecting the sixth branch-metric if the sixth branch-metric is greater than the branch-metric selected by the fifth selector, and otherwise selecting the branch-metric selected by the fifth selector, according to the fourth comparison signal;

a second adder for adding a branch-metric selected by the sixth selector to a second previous path-metric;

a fifth comparator for comparing the outputs of the first and second adders to output the MSB of the previous state information representing the survivor and a fifth comparison signal;

a seventh selector for selecting the greater one of the outputs of the first and second adders according to the fifth comparison signal, to output a new path-metric; and an eighth selector for selecting the greater one of the outputs of the second and fourth comparators according to the fifth comparison signal, to output the least significant bit (LSB) of the previous state information representing parallel path information of the selected survivor.

9. The TCM decoder of claim 6, wherein each of the second survivor decider comprises:

a first comparator for comparing a first branch-metric with a second branch-metric to output a first comparison signal;

a first selector for selecting the second branch-metric if the second branch-metric is greater than the first branch-metric, and otherwise selecting the first branch-metric, according to the first comparison signal;

a second comparator for comparing the branch-metric selected by the first selector with a third branch-metric to output a second comparison signal;

a second selector for selecting the third branch-metric if the third branch-metric is greater than the branch-metric selected by the first selector, and otherwise selecting the branch-metric selected by the first selector, according to the second comparison signal;

a first adder for adding a branch-metric selected by the second selector to a first previous path-metric;

a third comparator for comparing a fourth branch-metric with a fifth branch-metric to output a third comparison signal;

a third selector for selecting the fifth branch-metric if the fifth branch-metric is greater than the fourth branch-metric, and otherwise selecting the fourth branch-metric, according to the third comparison signal;

a fourth comparator for comparing a branch-metric selected by the third selector with a sixth branch-metric to output a fourth comparison signal;

a fourth selector for selecting the sixth branch-metric if the sixth branch-metric is greater than the branch-metric selected by the third selector, and otherwise selecting the branch-metric selected by the third selector, according to the fourth comparison signal;

a second adder for adding a branch-metric selected by the fourth selector to a second previous path-metric;

a fifth comparator for comparing the outputs of the first and second adders to output the MSB of the previous state information representing the survivor and to output a fifth comparison signal;

a fifth selector for selecting the greater one of the outputs of the first and second adders according to the fifth comparison signal, to output a new path-metric; and a sixth selector for selecting the greater one of the outputs of the second and forth comparators according to the comparison signal of the fifth comparator, to output the least significant bit (LSB) of the previous state information representing parallel path information of the selected survivor.

10. The TCM decoder of claim 7, wherein the normalizer comprises:

a detector for selecting the MSBs of the new path-metrics at each state, output from the first and second survivor deciders, and performing an OR operation on the selected MSBs, to output the result as a detection signal; and a bit controller for outputting the remaining lower bits other than the MSB of each of the new path-metrics, or the remaining upper bits other than the LSB of each of the new path-metrics, as normalized path-metrics.

11. The TCM decoder of claim 2, wherein the trace-back memory adopts a 3-point even algorithm.

12. The TCM decoder of claim 6, wherein the trace-back memory comprises:

a plurality of RAMs each of a size corresponding to half of a decoding depth (L), for storing the previous path information at each state generated by the addition-comparison selector;

a first trace-back unit for tracing back data stored in the RAMs by a length corresponding to L/2 from a initial state value;

a second trace-back unit for tracing back the data stored in the RAMs by a further length L/2 from the state of the traced back to by the first trace-back unit;

a decoding unit for decoding data read out from RAMs at the state decided as the optimal path according to the result of the traced back by the second trace-back unit, to output decoded data;

a first reading controller for reading the data stored in one of the RAMs according to the operation mode, and for applying the read data to the first trace-back unit;

a second reading controller for reading the data stored in another of the RAMs according to the operation mode, and for applying the read data to the second trace-back unit;

a third reading controller for reading the data stored in yet another of the RAMs according to the operation mode, and for applying the read data to the decoding unit;

a forward converter for converting the sequence of the decoded data output from the decoding unit to the forward direction; and an address generator for controlling data writing and reading to and from each RAM, and for outputting a selection signal according to the operation mode to the first through third reading controllers, and outputting write and read addresses of the forward converter.

13. The TCM decoder of claim 12, wherein the address generator comprises:

a first counter for generating an up-address in order to generate write addresses for each RAM;

a second counter for generating a down-address in order to generate read addresses for each RAM;

a third counter for counting the number of carry of the second counter to apply a selection signal for selecting each RAM to the first through third reading controllers;

an address controller for outputting the up-address generated by the first counter as the write address of each RAM and the read address of the forward converter, and the down-address generated by the second counter as the read address of each RAM and the write address of the forward converter;

a first generator for comparing the up-address generated by the first counter with the first predetermined number to output the result of the comparison as an enable signal for the first and second trace-back units and the decoding unit; and a second generator for generating control signals for the address controller and the first through third write controllers, write and read control signals of each RAM, and the enable signal of the forward converter, according to the output of the third counter.

14. The TCM decoder of claim 13, wherein the first trace-back unit comprises:

a first selector for selectively outputting a predetermined initializing state value or a first feedback state value according to the enable signal output by the first generator, and for outputting the selected result as a current state value;

a second selector for selecting the previous state information of one state from the previous state information of each state output from the pattern inserter according to the current state value;

a first state value generator for generating a previous state value for the 4-state case, by selecting the LSB selected by the first selector as the MSB and the MSB of the output selected by the second selector as the LSB and inserting "0" as the middle bit;

a second state value generator for generating a previous state value for the 8-state case, by selecting the lower two bits of the state value selected by the first selector as upper bits and the MSB of the output selected by the second selector as the LSB;

a third selector for selecting the previous state value for the 4-state case in the 4-state mode, and the previous state value for the 8-state case in the 8-state mode, according to the 4-state/8-state mode;

a first comparator for comparing the previous state information of each state output by the pattern inserter with the predetermined data pattern, and for outputting a first comparison signal representing the segment sync period if the two compared values are equal to each other;

a fourth selector for selecting the output selected by the third selector at times other than the segment sync period, and the first feedback state value during the segment sync period, according to the first comparison signal; and a first delay for delaying a state value selected by the fourth selector by the first predetermined number of symbols and for outputting the delayed result to the first and fourth selectors as the first fedback state value.

15. The TOM decoder of claim 14, wherein the second trace-back unit comprises:

a fifth selector for selectively outputting a state value output by the first delay of the first trace-back unit or a second fedback state value according to the enable signal output by the first generator, and for outputting the selected result as a current state value;

a sixth selector for selecting the previous state information of one state from the previous state information of each state output from the pattern inserter according to the current state value output by the fifth selector;

a third state value generator for generating a previous state value for the 4-state case, by selecting the LSB selected by the fifth selector as the MSB and the MSB of the output selected by the sixth selector as the LSB and inserting "0" as the middle bit;

a fourth state value generator for generating a previous state value for the 8-state case, by selecting the lower two bits of the state value selected by the fifth selector as upper bits and the MSB of the output selected by the sixth selector as the LSB;

a seventh selector for selecting the output of the third state value generator in the 4-state mode and the output of the fourth state value generator in the 8-state mode, according to the 4-state/8-state mode;

a second comparator for comparing the previous state information of each state output by the pattern inserter with the predetermined data pattern, and for outputting a second comparison signal representing the segment sync period if the two compared values are equal to each other;

an eighth selector for selecting the output selected by the seventh selector at times other than the segment sync period, and the second feedback state value during the segment sync period, according to the second comparison signal; and a second delay for delaying the state value selected by the eighth selector by the first predetermined number of symbols and for outputting the delayed result to the fifth and eighth selectors as the second fedback state value.

16. The TCM decoder of claim 15, wherein the decoding unit starts decoding the previous state value of the first twelve symbols when the tracing back, which has started from the last symbol read from one RAM, reaches the first symbol read from that RAM.

17. The TCM decoder of claim 16, wherein the decoding unit comprises:

a ninth selector for selectively outputting a state value output by the second delay of the second trace-back unit or a third fedback state value according to the enable signal output by the first generator, and for outputting the selected result as a current state value;

a tenth selector for selecting the previous state information of one state from the previous state information of each state output from the pattern inserter according to the current state value output by the ninth selector;

a first path information generator for generating 4-state path information by selecting only the MSB and LSB of the state value selected by the ninth selector and collating the selected bits with the previous state information selected by the tenth selector;

a second path information generator for generating 8-state path information by collating the state value selected by the ninth selector with the previous state information selected by the tenth selector;

a first ROM for reading out the previously stored decoded data for the 4-state case by receiving the path information generated by the first path information generator as an address;

a second ROM for reading out the previously stored decoded data for the 8-state case by receiving the path information generated by the second path information generator as an address;

an eleventh selector for selecting the decoded data stored in the first ROM in the 4-state case, and the decoded data stored in the second ROM in the 8-state case, according to the 4-state/8-state mode;

a fifth state value generator for generating a previous state value for the 4-state case, by selecting the LSB selected by the ninth selector as the MSB and the MSB of the output selected by the 10th selector as the LSB and inserting "0" as the middle bit;

a sixth state value generator for generating a previous state value for the 8-state case, by selecting the lower two bits of the state value selected by the ninth selector as upper bits and the MSB of the output selected by the tenth selector as the LSB;

a twelfth selector for selecting the output of the fifth state value generator in the 4-state mode and the output of the sixth state value generator in the 8-state mode, according to the 4-state/8-state mode;

a third comparator for comparing the previous state information of each state output by the pattern inserter with the predetermined data pattern, and for outputting a third comparison signal representing the segment sync period if the two compared values are equal to each other;

a thirteenth selector for selecting the output selected by the twelfth selector at times other than the segment sync period, and selecting the third feedback state value during the segment sync period, according to the third comparison signal; and a third delay for delaying a state value selected by the thirteenth selector by the first predetermined number of symbols and for outputting the delayed result to the ninth and thirteenth selectors as the third feedback state value.

18. The TCM decoder of claim 17, wherein the forward converter comprises:

two memories for alternately writing and reading data, by writing data according to the down-address of the second counter and reading data according to the up-address of the first counter, and for outputting the decoded data output by the eleventh selector in the forward direction;

a differential decoder for differential decoding only the MSB of the decoded data read from the memories; and an output unit for outputting the final decoded data by selecting the output of the differential decoder in the 4-state mode, and the decoded data read from each memory in the 8-state mode, according to the 4-state/8-state mode.

19. The TCM decoder of claim 18, wherein the differential decoder comprises:

a fourteenth selector for selecting only the MSB of the decoded data output from each memory at times other than the segment sync period, and selecting a fedback signal during the segment sync period, according to the third segment sync control signal;

a hold & delay unit for delaying the output of the fourteenth selector by the first predetermined number of symbols to output the delayed result as the fedback signal, and for holding the output of the fourteenth selector according to the second field sync control signal; and an exclusive OR gate for performing an exclusive OR operation on the output of the hold & delay unit and the MSB of the decoded data output from the memories.

20. The TCM decoder of claim 18, wherein the output unit comprises:

an MSB selector for selecting only the MSB of the decoded data output from the memories, and for applying the selected result to the differential decoder;

a bit collator for collating the differential decoded MSB output from the exclusive OR gate with the LSB which is not selected by the MSB selector; and a fifteenth selector for selecting the output of the bit collator in the 4-state mode, and the decoded data read from the memories in the 8-state mode, according to the 4-state/8-state mode.

21. The TCM decoder of claim 12, wherein each RAM operates according to a clock the frequency of which is based the frequency of a system clock.

22. The TCM decoder of claim 18, wherein each memory operates according to a clock the frequency of which is based on a predetermined multiple of the frequency of a system clock.

23. A method of trellis-coded modulation (TCM) decoding a high-definition television (HDTV) signal, in which an input HDTV signal goes through National Television System Committee (NTSC) rejection filtering in order to eliminate interference by an NTSC signal, the NTSC rejection filtering performed by delaying the HDTV signal by a first predetermined number of symbols, and by subtracting the delayed signal from the HDTV signal, wherein the HDTV signal constitutes each of its frames with two fields, each field includes field sync segments and data segments, each segment includes a segment sync signal, and each field sync segment has a field sync signal, the TCM decoding method comprising the steps of:

(a) directly connecting the data before and after the first predetermined number of symbols based on the segment sync signal when the input HDTV signal has passed through the NTSC rejection filtering, and passing the input HDTV signal unchanged when the input HDTV signal has not passed through the NTSC rejection filtering;

(b) directly connecting the data of the data segment just before the field sync segment to the data of the data segment just after the field sync segment, after the step (a); and (c) Viterbi-decoding the HDTV signal obtained by the step (b) in accordance with either an 8-state case where the input HDTV signal has passed through the NTSC rejection filtering and a 4-state case where the input HDTV signal has not passed through the NTSC rejection filtering.

24. The TCM decoding method of claim 23, wherein the step (b) comprises the sub-steps of:

(b1) delaying the data obtained by the step (a) by the first predetermined number of symbols; and (b2) selecting the data obtained by the step (a) during the field sync period, and the data obtained by the step (b1) during any other period.

25. The TCM decoding method of claim 23, wherein the step (c) comprises the sub-steps of:

(c1) obtaining branch-metrics by calculating the error between the data obtained by the step (b) and a plurality of reference signal levels according to the 4-state/8-state mode;

(c2) deciding the optimal path at the current node of each state by using each branch-metric converging on each state and a path metric accumulated up to the previous symbol, according to the 4-state/8-state mode, and for outputting the selected path as the optimal path information; and (c3) tracing back the optimal path information according to the 4-state/8-state mode and for outputting decoded data based on the traced-back result.

26. The TCM decoding method of claim 25, wherein the sub-step (c3) is performed using a 3-point even algorithm.

* * * * *